US009449979B2

(12) United States Patent
McKinnon et al.

(10) Patent No.: US 9,449,979 B2
(45) Date of Patent: Sep. 20, 2016

(54) FERROELECTRIC MEMORY DEVICE AND FABRICATION PROCESS THEREOF, AND METHODS FOR OPERATION THEREOF

(71) Applicants: Thomas J McKinnon, North Vancouver (CA); Erol Girt, Burnaby (CA)

(72) Inventors: Thomas J McKinnon, North Vancouver (CA); Erol Girt, Burnaby (CA)

( * ) Notice: Subject to any disclaimer, the term of this patent is extended or adjusted under 35 U.S.C. 154(b) by 0 days.

(21) Appl. No.: 14/920,826

(22) Filed: Oct. 22, 2015

(65) Prior Publication Data

US 2016/0172365 A1 Jun. 16, 2016

Related U.S. Application Data

(60) Provisional application No. 62/074,047, filed on Nov. 2, 2014.

(51) Int. Cl.
*G11C 11/22* (2006.01)
*H01L 27/115* (2006.01)

(52) U.S. Cl.
CPC ...... *H01L 27/11507* (2013.01); *G11C 11/2273* (2013.01); *G11C 11/2275* (2013.01)

(58) Field of Classification Search
CPC ..... G11C 17/06; G11C 17/14; G11C 29/822; G11C 29/846; G11C 7/18; G11C 5/063
USPC ............ 257/E27.026, 390, E27.102, E51.04, 257/471, 401, 52, 54, E21.666, E31.034, 257/E31.047, E51.023; 365/96, 100, 163, 365/72
See application file for complete search history.

(56) References Cited

U.S. PATENT DOCUMENTS 6,049,110 A * 4/2000 Koh .................. H01L 29/66772
257/280

* cited by examiner

*Primary Examiner* — Thong Q Le

(57) ABSTRACT

A new form of a solid-state non-volatile memory cell is presented. The solid-state memory cell comprises a series of different layers of ferroelectric materials, semiconductors, ferroelectric semiconductors, metals, and ceramics, and oxides. The memory device stores information in the direction and magnitude of polarization of the ferroelectric layers. Additionally, a method is presented for storing multiple bits of information in a single memory cell by allowing partial polarization of a single ferroelectric layer and stacking of multiple ferroelectric functional units on top of each other. Additionally, a technique for reading and writing said memory cell is presented. Additionally, the memory cell design allows for the formation of Schottky barriers which act to improve functionality and increase resistance. Additionally, a method is presented for depositing textured lithium niobate thin films.

17 Claims, 29 Drawing Sheets

XRD ROCKING CURVE EXPERIMENTAL DATA OF <0001> LiNbO₃ PEAK WITH FWHM=4.8 DEGREES

XRD θ-2θ EXPERIMENTAL DATA FOR NON SHIFTED <0001> LiNbO₃ PEAK AND SHIFTED <0001> LiNbO₃ PEAK

*EXPERIMENTAL IV CURVE DATA OF MEMORY CELL WITH LARGE SCHOTTKY BARRIER, MEDIUM SCHOTTKY BARRIER, SMALL SCHOTTKY BARRIER, AND OHMIC CONTACTS*

*EXPERIMENTAL IV CURVE DATA SHOWING THE HIGH RESISTANCE AND LOW RESISTANCE STATE IV CURVES*

EXAMPLES OF LAYERS WITHIN BOTTOM CONTACT 12A
FIG. 16A   Ta 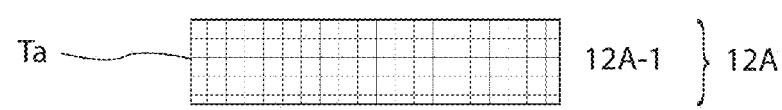 12A-1 } 12A
FIG. 16B   CoRu / Ta 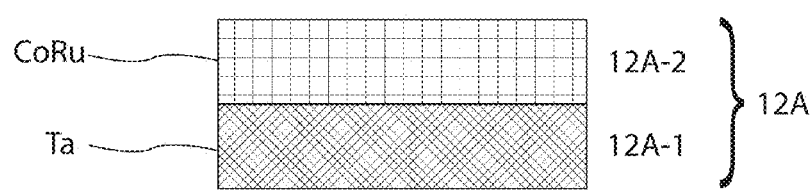 12A-2 / 12A-1 } 12A
FIG. 16C   CoRu / NiFe / Ta 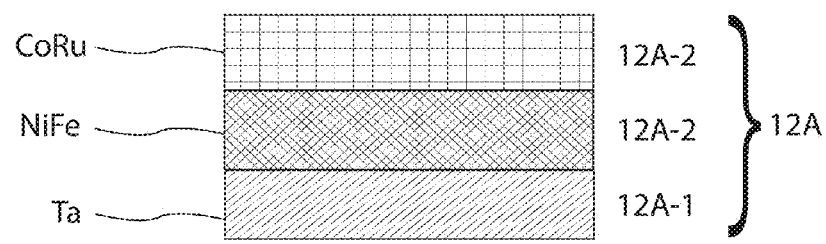 12A-2 / 12A-2 / 12A-1 } 12A
FIG. 16D   SrRuO$_3$ / Pt / MgO / Ta 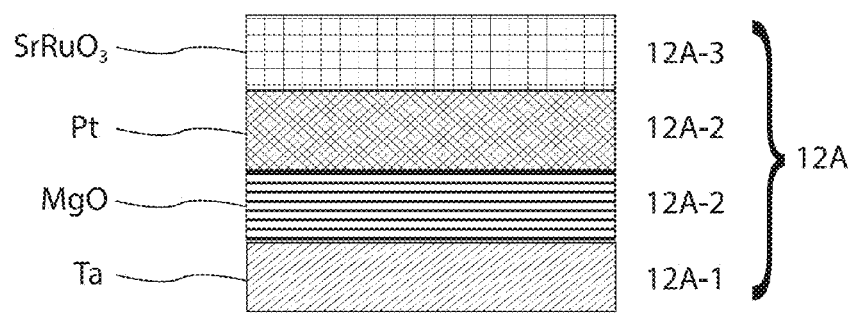 12A-3 / 12A-2 / 12A-2 / 12A-1 } 12A

EXAMPLES OF LAYERS WITHIN TOP CONTACT 12B

*EXPERIMENTAL PFM DATA SHOWING BUTTERFLY HYSTERESIS CURVE FOR 17nm THICK LINBO3. DISPLACEMENT MEASURED IN Z DIRECTION*

EXPERIMENTAL PFM DATA SHOWING PHASE HYSTERESIS LOOP FOR 17nm THICK LiNBO3.
PHASE MEASURED IN Z DIRECTION

*EXPERIMENTAL PFM PHASE IMAGE FOR 17nm THICK LINBO3 WITH THE WORD "HI" WRITTEN INTO THE FERROELECTRIC POLARIZATION. LIGHTER AREAS ARE POLARIZED UPWARDS (+Z), DARKER AREAS ARE POLARIZED DOWNWARDS (-Z)*

EXPERIMENTAL CONDUCTIVE AFM IMAGE FOR 17nm THICK LiNBO3 (SAME AS FIGURE 20) WITH THE WORD "HI" WRITTEN INTO THE FERROELECTRIC POLARIZATION, SHOWING VISUALLY THAT CURRENT AND RESISTANCE IS DEPENDENT ON FERROELECTRIC POLARIZATION DIRECTION

DEFINITION AND FUNCTION OF LAYERS WITHIN BOTTOM CONTACT 12A

XRD θ-2θ EXPERIMENTAL DATA FOR Ta(6nm, 10nm, 16nm, 24nm) ON GLASS

XRD θ-2θ EXPERIMENTAL DATA FOR HCP <0001> ALIGNED BOTTOM CONTACT

XRD θ-2θ EXPERIMENTAL DATA FOR FCC<111> ALIGNED BOTTOM CONTACT

XRD θ-2θ EXPERIMENTAL DATA FOR MgO FCC<001> ALIGNED BOTTOM CONTACT

*XRD θ-2θ EXPERIMENTAL DATA FOR COMBINED CRYSTAL SYSTEMS IN BOTTOM CONTACT*

Perovskite crystal structure and lattice.
Chemical formula: $ABO_3$

One of the <001> directions
One of the <111> directions
One of the <110> directions

FERROELECTRIC MEMORY DEVICE AND FABRICATION PROCESS THEREOF, AND METHODS FOR OPERATION THEREOF

CROSS-REFERENCE TO RELATED APPLICATIONS

This is a non-provisional utility application claiming benefit of previously filed provisional application with application No.: 62/074,047 on date: 2014 Nov. 2, titled: Ferroelectric memory device.

STATEMENT REGARDING FEDERALLY SPONSORED RESEARCH CR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISK CR AS A TEXT FILE VIA THE OFFICE ELECTRONIC FILING SYSTEM (EFS-WEB)

Not applicable

STATEMENT REGARDING PRIOR DISCLOSURES BY THE INVENTOR OR A JOINT INVENTOR

Not applicable

BACKGROUND OF THE INVENTION

The present invention generally pertains to two fields of endeavor: memory devices and photonics. More particularly, the present invention pertains to ferroelectric memory cells that store information in the direction of polarization of a ferroelectric film, and secondly, electronic or photonic devices that source, detect, modify, and control light.

The civilized world has a great need to store information for one purpose or another, and all of the information is stored in memory devices of one form or another. Supercomputers, cloud storage infrastructure, personal computers, mobile phones and more all require memory to function. Each application generally requires memory that is specifically designed for it. That is, server farms require low cost high-density memory, mobile devices require low power memory, and supercomputers require high speed memory. Currently, different memory devices are used for each of the applications in order to better meet the needs of the application. A memory device containing the memory cells presented in this patent has the characteristics to potentially replace many forms of existing memory because it is non-volatile (Information is saved even when the power is turned off), have high memory density, high speed, good reliability, and low power usage.

Some aspects of the current invention are unrelated to any prior art that could be found. However, the use of a ferroelectric memory element in conjunction with a single Schottky barrier is known in the art and is disclosed, for example, in U.S. Pat. No. 5,512,773 of Wolf et al. The Wolf patent is believed to indicate the general state of the art and to contain a discussion of the general theory of operation of such a memory element.

Parts of this invention also pertain to photonic devices. For many years, ferroelectric materials have been used extensively in various photonic devices including, optoelectronic modulators, terahertz wave generation, spectroscopy, and tunable phase arrays. However, many ferroelectric materials, including lithium niobate, have proven difficult to properly manufacture on the nano-scale. This has slowed innovation in this field and made it difficult to create integrated photonic circuits. This invention solves this problem by presenting a method for depositing well-textured lithium niobate on the nano-scale.

Methods for depositing lithium niobate by RF sputtering is known in the art and is disclosed, for example, in U.S. Pat. No. 3,649,501 to Sadagopan et al. The Sadagopan patent is believed to indicate the general state of the art.

BRIEF SUMMARY OF THE INVENTION

The solid-state memory cell presented comprises a series of different layers of ferroelectric materials, semiconductors, ferroelectric semiconductors, metals, ceramics, and oxides. The basic structure of one of the embodiments of the memory cell is shown in FIG. 1. It is comprised of a substrate 10, bottom electrode 12A, a Schottky modulating interlayer 100, a ferroelectric layer 13, a Schottky modulating interlayer 101, and a top electrode 12B. The substrate will contain electronic circuitry that is capable of sending electrical current or voltage to a single memory cell at a time. Traditionally, this is composed of a transistor below the bottom electrode with word and bit lines, or can be composed of lines of conducting material separated from one another by insulating material. In the second case, the memory cell will sit on top of one of the conducting lines, and above the memory cell will be more conducting lines separated by each other with insulating material that run in the plane of the sample and run in a direction orthogonal to the conducting lines below the memory cell. One of the purposes of the top and bottom electrodes is to provide electrical contact with the top and bottom of the ferroelectric layer. Furthermore, the bottom electrode has a specific composition as to establish the desired growth of the ferroelectric layer above it. Furthermore, the bottom and top electrode are composed of materials that are as noble as possible so that they do not oxidize or react at any unwanted points during the growth and fabrication process. The layers 100 and 101 are thin layers of a material with a specifically chosen work function. The purpose of these two layers is to create an Ohmic or Schottky contact at the interface between the ferroelectric 13 and layers 100 and 101.

Ferroelectric materials are a part of a larger group of materials that exhibit a phenomenon known as electric polarization. Ferroelectric materials have the unique property that once they are electrically polarized, they will remain so for long periods of time. The polarization that remains for long periods of time is known as the remnant polarization. The remnant polarization can also be seen schematically in the polarization-electric field (PE) hysteresis loop in FIG. 6. This figure shows the relationship between an external electric field and the ferroelectric polarization of the material. When a large electric field (E1) is applied, the sample becomes fully polarized. When the electric field is turned off, the polarization remains at P1. This polarization that remains is the remnant polarization.

The functioning of the present invention requires that at least some component of ferroelectric polarization be parallel or anti-parallel with the Z direction as shown in FIG. 1 to FIG. 5 and FIG. 10, which is parallel with the surface normal vector. A remnant polarization in a ferroelectric material can be induced and sustained in only a few directions of the crystal lattice of the ferroelectric material. These directions are called the easy axes of polarization. For example, the easy axis of lithium niobate is along the <0001> directions of the crystal. So in order to create a ferroelectric layer that can be polarized in the Z direction, the ferroelectric layer must have a specific crystal structure orientation that results in an easy axis pointing approximately parallel with the Z direction. The specific crystal structure to achieve this depends on the material being used. For example, if the easiest axis is in the <0001> directions, than the optimum film crystal growth would be having the <0001> directions parallel with the Z direction.

The preferred ferroelectric material for the present invention is lithium niobate (LiNbO3). Lithium niobate belongs to the trigonal crystal system and has a hexagonal unit cell. The spontaneous ferroelectric polarization of lithium niobate is along the <0001> c-axis directions. Thus, the present invention requires that the lithium niobate layer have the <0001> c-axis direction aligned as closely with the Z direction as possible.

X-ray diffraction (XFD) is the primary tool used to experimentally determine the crystallographic orientation of thin films. Two types of XFD scans that are used for this purpose are θ-2θ (theta-2theta) scans and rocking curve scans. The measurement geometry is described in FIG. 10. In a θ-2θ scan, the angle between an incident X-ray beam and the substrate surface, ω (omega), is the same as the angle between the reflected X-ray beam and the substrate surface, θ1, (ω=θ1=θ). In the rocking curve scan, the angle between the incident and reflected beams, θ2, is kept constant (i.e., ω+θ1 is kept constant) and the sample is rocked by angle ω. That is, ω is scanned from one angle to another. In both measurements, the imaginary plane formed by incident and diffracted X-ray beams is perpendicular to the substrate surface. The θ-2θ scan can be used to detect the growth direction of grains in the deposited layer—i.e., crystal growth direction of grains in a deposited layer perpendicular to the substrate surface and parallel to the Z direction. The rocking curve scan can be used to determine the degree of alignment of the growth directions of grains with the direction normal to the substrate surface in the layer (Z direction). The measure of alignment between the growth directions of grains in the layer is often expressed as the full width at half maximum (FWHM) of the peak obtained as a result of the rocking curve scan. This peak is narrow for a high degree of alignment between the growth directions of grains in the layer and the Z direction, and is wide for a low degree of alignment between the growth directions of grains in the layer and the Z direction.

One way of controlling this crystal structure orientation is by growing on top of a substrate or layer that has similar atomic spacing in the plane, or have a fraction 1/n, or multiple n, of the atomic spacing where n is an even number. If this is the case, the preferred crystal structure will have atoms in the plane that line up very well with the atomic spacing of the layer below it. This causes the crystal structure to energetically prefer growing with the desired crystal structure orientation. This is called lattice matching. It is also called growing on a lattice matched underlayer. An example having a bottom layer with ½ of the atomic spacing as compared to the layer above it can be seen in FIG. 7.

For the present invention, the preferred underlayer (the topmost layer within 12A in FIG. 1-5) is <0001> oriented cobalt ruthenium alloy ($Co_xRu_y$). Where x is approximately 63% and y is approximately 37%. When this is the case, this layer will have a perfect lattice match with <0001> lithium niobate. It will become clear later in this patent that x and y may be changed in order to change the properties of the lithium niobate layer above it. For the rest of this patent, the cobalt ruthenium alloy layer will be called CoRu. Growing an 80 nm lithium niobate layer on top of this underlayer followed by annealing at 500 degrees Celsius for 30 minutes results in a θ-2θ scan peak at 39 degrees, as can be seen in the experimental data in FIG. 12 as the non-shifted peak. This indicates that the lithium niobate layer is oriented in the <0001> direction as was desired. A rocking curve scan of the same sample gives a FWHM of 4.8 degrees for the <0001> lithium niobate peak and can be seen in the experimental data in FIG. 11. This FWHM indicates that the <0001> crystallographic orientation of the lithium niobate layer is very well aligned with the Z direction. If another interlayer is required in between the CoRu layer and the lithium niobate layer, like layer 100 in the memory cell in the present invention, as long as this layer is grown in a way as to maintain atomic spacing in the plane of the layer below it, then it is likely the lithium niobate layer will grow along <0001> crystallographic orientations. That said, the 100 layer may be amorphous or contain a different atomic spacing in the plane as compared to the layer below.

Growing lithium niobate on the CoRu underlayer as explained in this patent, ferroelectric hysteresis was observed in samples with a lithium niobate layer as thin as 3.3 nm. FIGS. 18 and 19 show hysteresis loop data obtained using a Piezoresponse Force Microscopy (PFM) for a 17 nm thick lithium niobate layer grown on top of CoRu. FIG. 18 shows hysteresis in the PFM amplitude, also known as a butterfly plot, while FIG. 19 shows the more standard hysteresis loop in the PFM phase parameter. These two figures indicate that lithium niobate grown on top of CoRu, as explained in this patent, has good ferroelectric properties, and a remnant polarization approximately parallel with the Z direction, for samples even as thin as 17 nm. FIG. 20 shows a PFM phase image of ferroelectric polarization on the surface of the 17 nm lithium niobate layer where the word "HI" was previously written into the ferroelectric polarization of the sample. The word was written into the sample by applying a voltage between the PFM tip and the sample, and moving the tip over the area of the letters "H" and "I". This shows one aspect of FIGS. 18, 19, that the lithium niobate layer has remnant polarization along the Z direction, but in a more visual way.

The lattice spacing of the CoRu underlayer can also be changed by varying the relative amounts of Co and Ru atoms in the alloy. This, in turn, can cause strain on the ferroelectric layer above it. Straining the ferroelectric layer can be advantageous because it causes some of its properties such as coercive field and remnant polarization to be changed. In the present invention, the ferroelectric layer may be strained in order to achieve optimum properties for use in a memory cell. FIG. 12 shows X-ray diffraction data of lithium niobate peaks from two different samples grown on top of <0001> CoRu. The non-shifted <0001> lithium niobate peak is at the position of 39 degrees. The shifted <0001> lithium niobate peak is at 39.25 degrees. This data shows that the lithium niobate XFD peak may be shifted using the cobalt ruthenium underlayer in the present invention. Shifting a θ-2θ XFD peak indicates that the crystal lattice spacing has been changed and that the ferroelectric is now strained.

Many ferroelectric materials are also semiconductors. This is the case for the preferred ferroelectric material for the present invention, lithium niobate. Any interface between a semiconductor and metal can potentially create a Schottky barrier. In the present invention, the layers 100 and 101 are used to create or remove the Schottky barrier at the interface with the ferroelectric layer 13. This can be advantageous for 2 reasons: 1) Schottky barriers will cause the overall resistance of the device to increase and the IV curve will become diode-like. This allows the memory cell in the current invention to be used in a so called crossbar array configuration without the need for a transistor directly beneath the memory cell, similar to that described in U.S. Pat. No. 4,876,668. For a memory cell to work in a crossbar array, it must have a significant resistance so that writing to one cell will not affect the polarization direction in the other cells around it. One solution to this problem is to place resistors or diodes in series with the memory cell, as is done in U.S. Pat. No. 20,070,015,348. But by having Schottky barriers within the ferroelectric material, as can be done in the present invention, the resistance is high enough that no additional resistors or diodes in series with the memory cell are required to work in the crossbar array configuration. 2) The Schottky barrier height can be changed depending on the direction of polarization of the ferroelectric layer 13. Changing the height of the Schottky barrier will cause a very large change in resistance in the memory cell. Therefore, the electrical resistance of the memory cell will change significantly depending on the direction of polarization of the ferroelectric layer 13. This is important for reading the memory cell, which will become clear later in the summary of the current invention.

If the ferroelectric is an n-type semiconductor, like undoped lithium niobate, a Schottky barrier will form at the interfaces on either side of the ferroelectric layer 13, only if the work function of layers 100 or 101 is high enough. If a material with a lower work function is used then an Ohmic contact will form. FIG. 13 shows experimental IV curve data obtained from the memory cell in the current invention. IV 201 contains layer 101 with a work function of about 4.5 eV, IV 202 contains layer 101 with a work function of about 4.7 eV, IV 203 contains layer 101 with a work function of about 5.0 eV, IV 204 contains layer 101 with a work function of about 5.2 eV. In all 4 of these IV curves, layer 100 was chosen so that no Schottky barrier was formed at the bottom of the ferroelectric layer. The significant change in IV curves in FIG. 13 is due to the barrier at the interface between the ferroelectric layer 13 and layer 101. If the ferroelectric is a p-type semiconductor, then the metal needs a low work function to form a Schottky barrier.

When the ferroelectric layer is thin enough, from one monolayer (approximately ~0.2 nm) to approximately 5 nm, another phenomenon acts to further change the resistance of the memory cell when ferroelectric polarization is reversed. When the ferroelectric layer is this thin, electrons have a significant probability to tunnel through the ferroelectric layer. In this case the ferroelectric layer would cause a potential barrier for the electrons. The probability of the electrons to tunnel through the potential barrier is highly dependent on the shape of the potential. The electric field created by the polarization of the ferroelectric layer changes the shape of the potential barrier, which increases or decreases the probability for electrons to tunnel through the barrier depending on the direction of polarization. The difference in probability for the tunneling electrons through a ferroelectric layer with opposite polarization directions causes a measurable difference in the resistance of the memory device.

The change of resistance between polarization magnitude and direction can be increased further by adding semiconducting layers (14A, and 14B in FIG. 2, 3, 4, 8, 9) above or below or both above and below the ferroelectric layer. In FIG. 8, 9 the layer 14B is a highly doped n-type semiconductor (Fermi energy EF is larger than the conduction band energy EC). In FIG. 8, 9 EV represents the valence band energy. This can cause an additional electron tunneling barrier within the semiconducting layer on either side of the ferroelectric. The width of the tunneling barrier along with the potential energy of this configuration is shown in FIG. 8 and FIG. 9. These figures show the layers of the third embodiment, but the principles and idea can also be applied and used in the other embodiments. By changing the direction or magnitude of the polarization, the width of the tunneling barrier can be increased or decreased which will further increase the change in resistance when changing the polarization of the ferroelectric layer 13.

Further functioning and features of the device will become apparent from the following detailed description of the preferred embodiments when read in conjunction with the attached drawings.

BRIEF DESCRIPTION OF THE SEVERAL VIEWS OF THE DRAWINGS

FIG. 16A, 16B, 16C, 16D are three possible but not limiting configurations of the layers within the bottom electrode 12A

DETAILED DESCRIPTION OF THE INVENTION

Representation of Data

Figure 14:
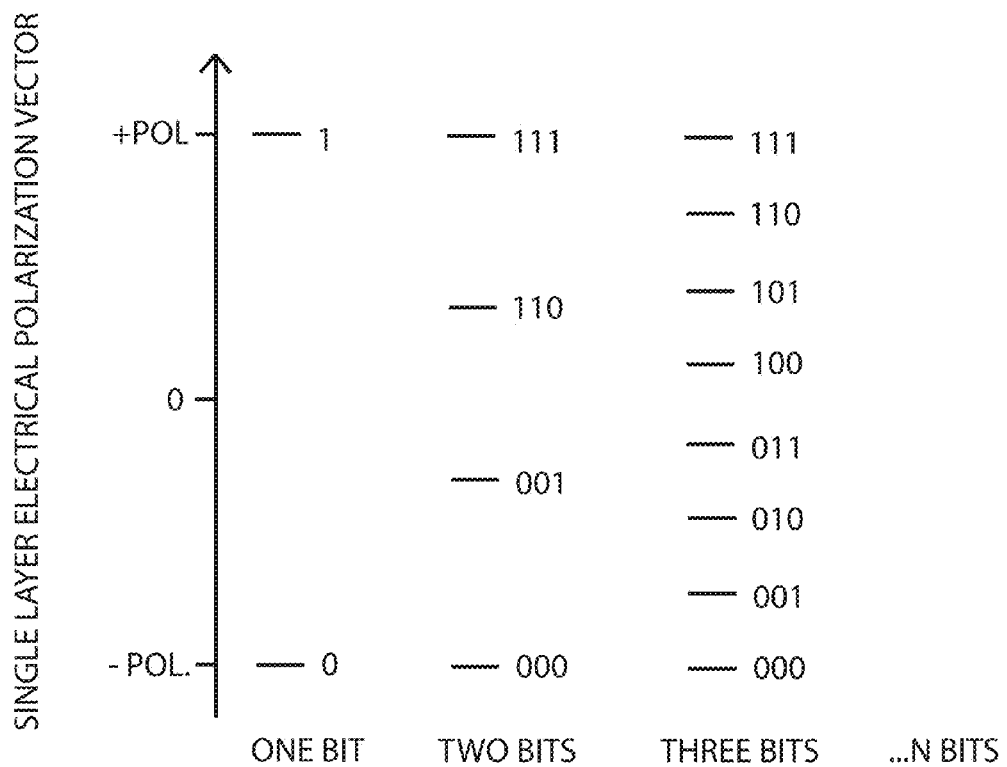
FIG. 14 is a diagram showing one way of mapping multiple bits of binary information into the magnitude and direction of polarization of a single ferroelectric layer.

The memory cell in the present invention can store information by assigning binary numerical values to the direction of polarization and also the magnitude of polarization. This allows for the storage of one or more bits of information within a single ferroelectric layer. An example of how this could work, for a single ferroelectric layer, is shown in FIG. 14. The +POL. and −POL. directions are parallel and anti-parallel with the Z direction.

Figure 5:
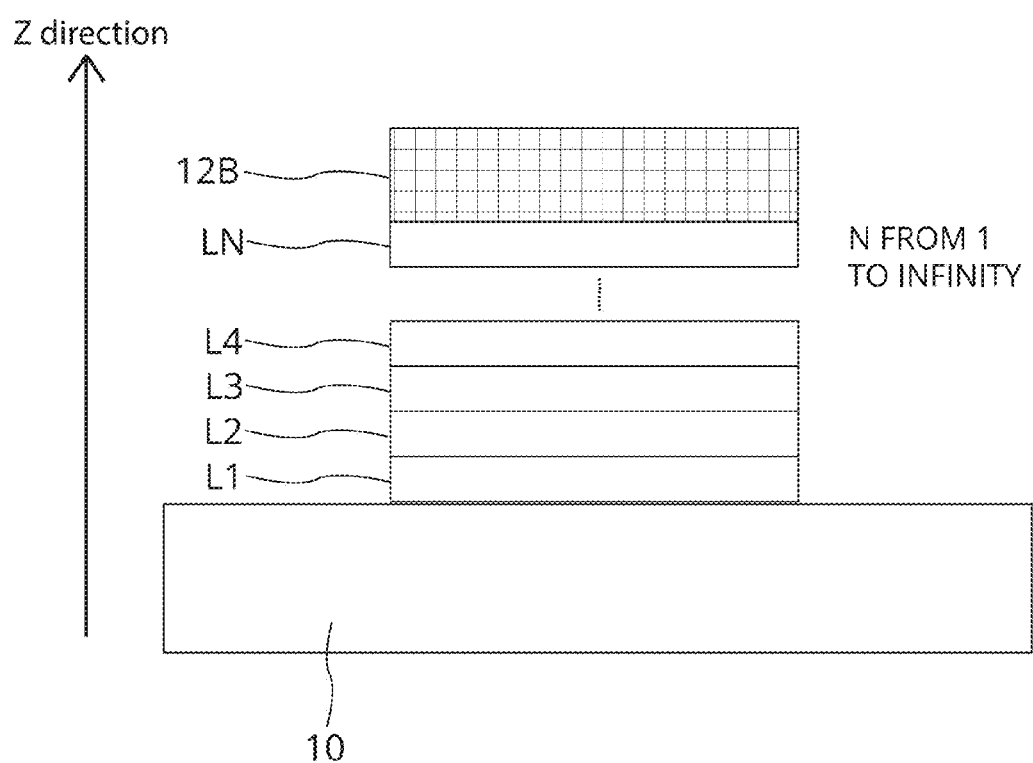
FIG. 5 is a diagram showing the construction of the ferroelectric memory device according to the fifth embodiment of the present invention.

More bits can be stored in each memory cell by stacking layers on top of each other as follows: Each of the presented devices, FIG. 1, 2, 3, 4, have a repeatable section shown as R1, R2, R3, R4. These repeatable sections may be stacked on top of each other many times in a single device to allow for a single device to hold many more bits of information. Each one of these repeated layers will be able to hold additional bits of information. The configuration of layers with repeated sections is shown in FIG. 5, where each of the layers L1 to LN is a single repeated layer. The presented memory device can have any number of repeated layers, from 1 single repeated layer, corresponding to a device that holds a single bit of information, to an infinite number of repeated layers.

Writing

Figure 6:
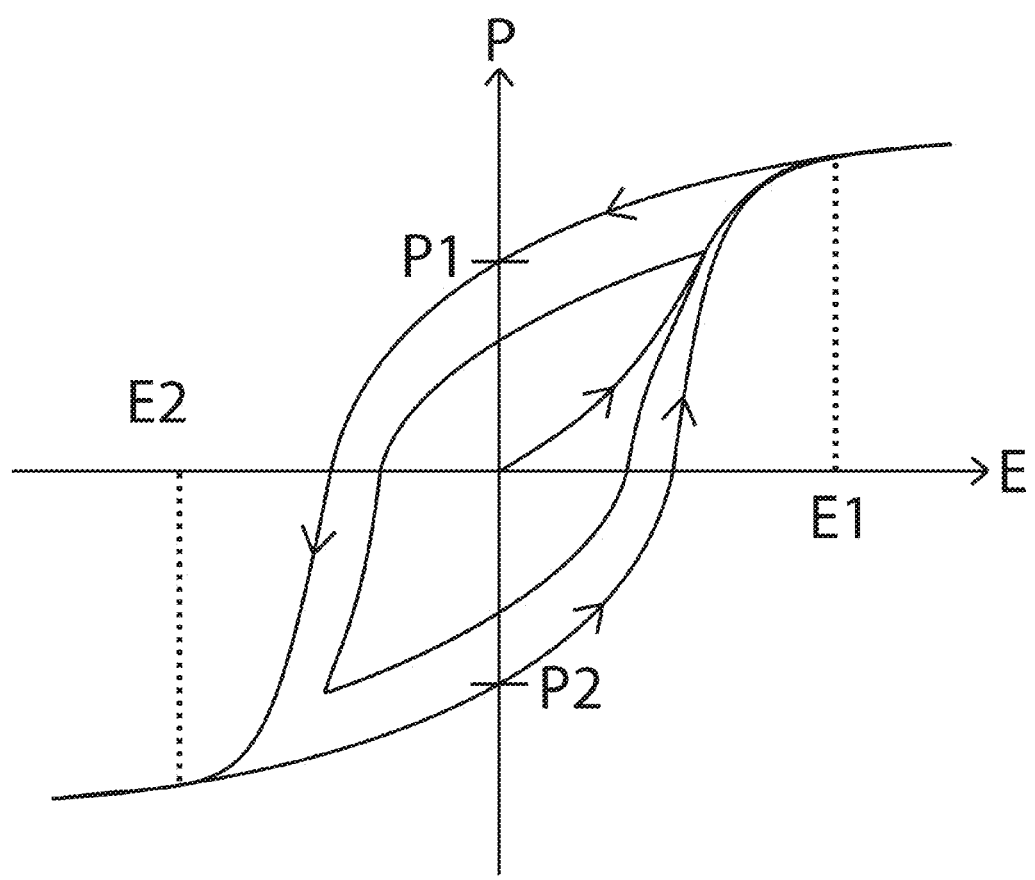
FIG. 6 is a diagram showing a typical hysteresis loop relating polarization of the ferroelectric layer with the applied electric field.
Figure 7:
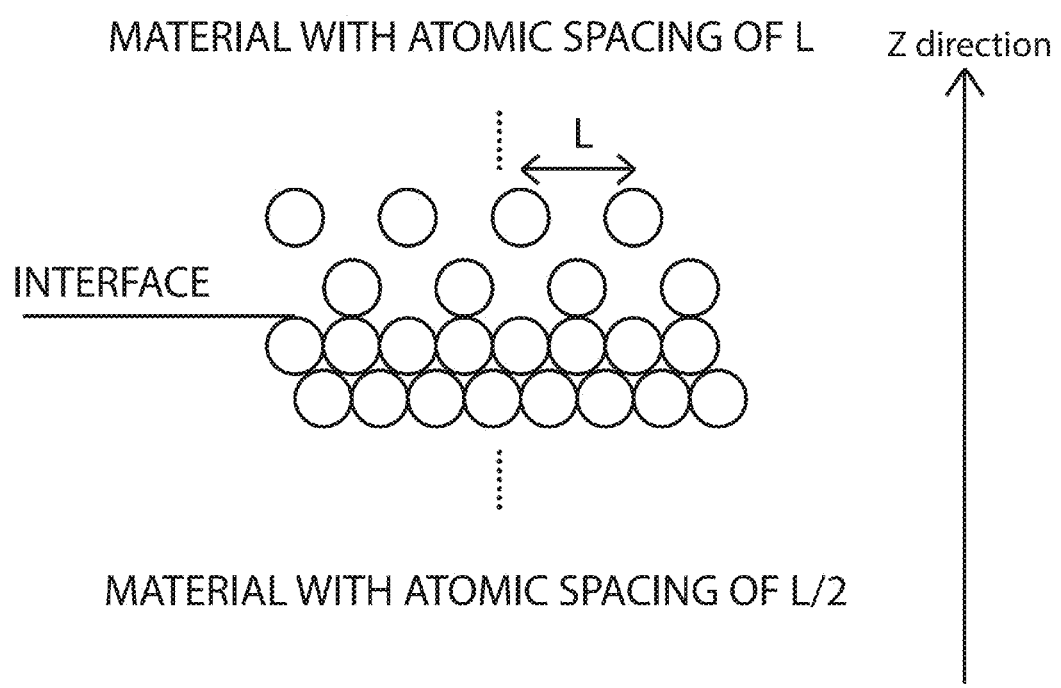
FIG. 7 is a diagram showing lattice matching where the bottom layer has half of the atomic spacing of some of the atoms in the material above. The top layer may have smaller atoms in the spaces between the atoms shown, but these smaller atoms are not shown.
Figure 8:
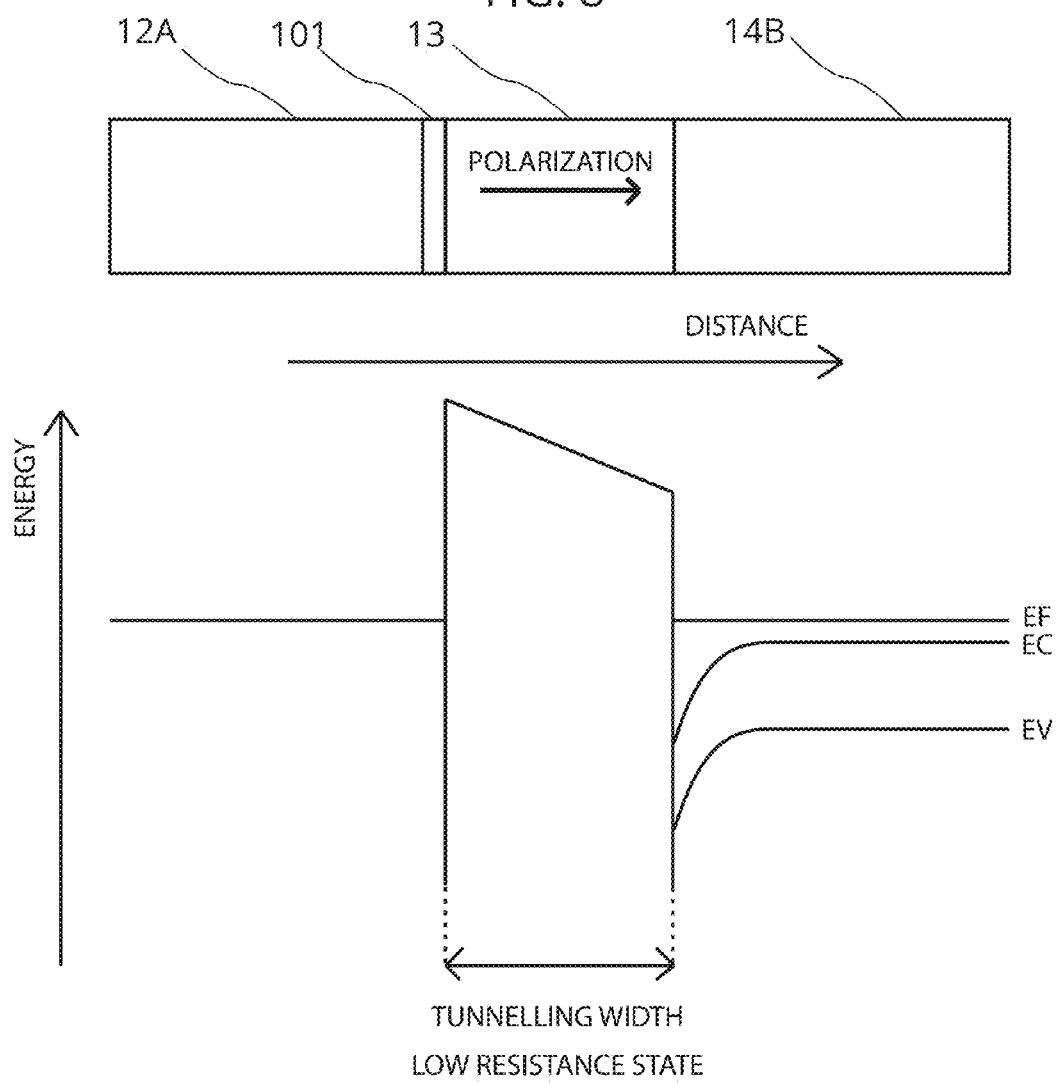
FIG. 8 is a diagram showing the electron tunneling width and potential energy plot of one possible configuration of the third embodiment. EF is the Fermi energy, EC is the conduction band energy, and EV is the valence band energy.
Figure 9:
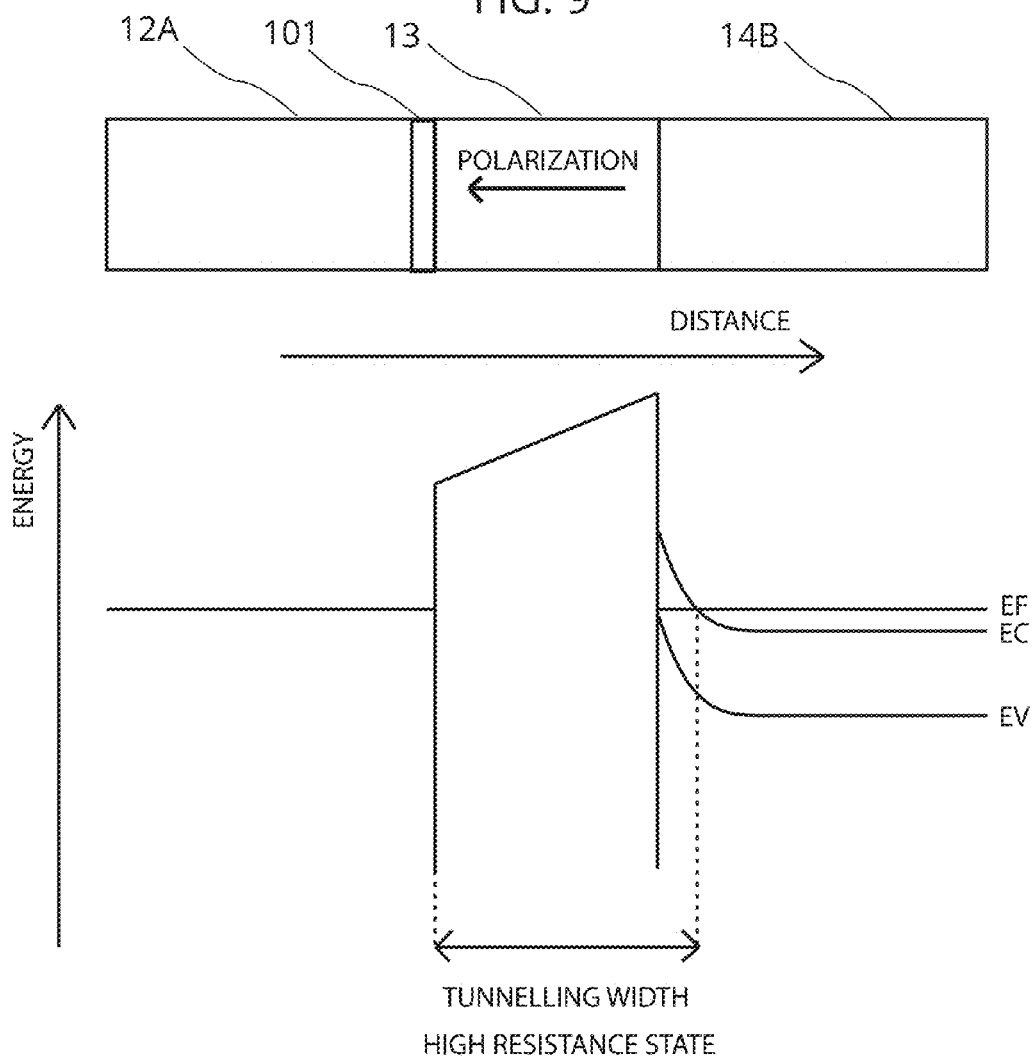
FIG. 9 is a diagram showing the electron tunneling width and potential energy plot of one possible configuration of the third embodiment. EF is the Fermi energy, EC is the conduction band energy, and EV is the valence band energy.
Figure 10:
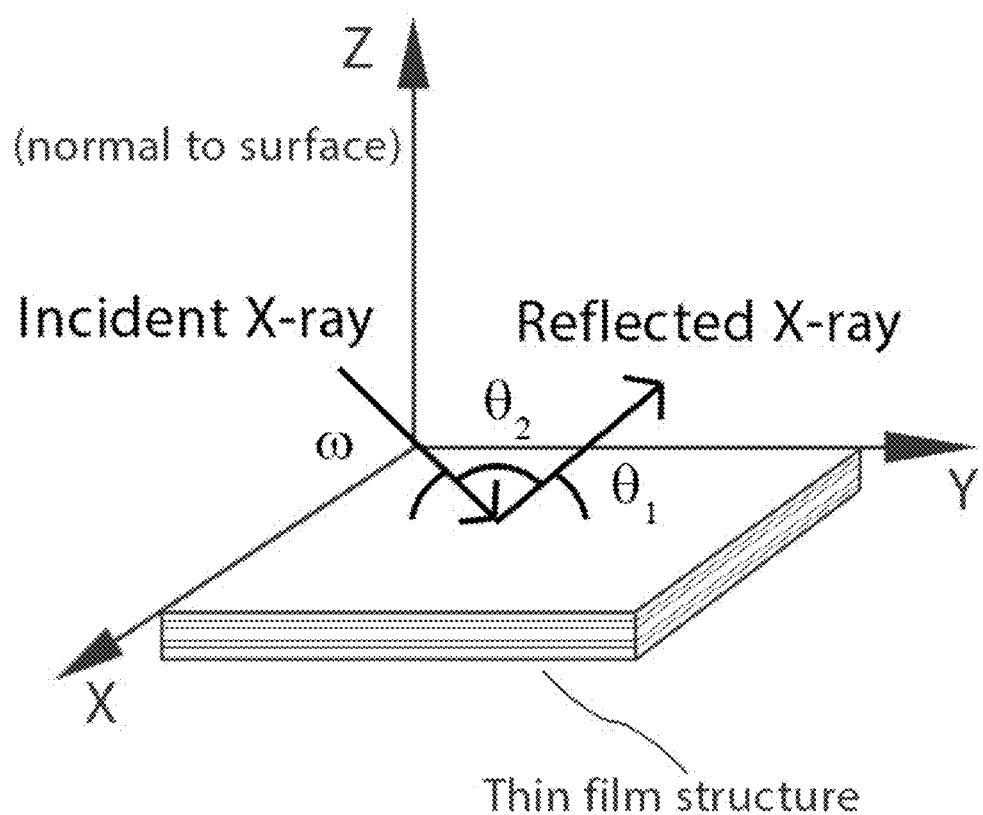
FIG. 10 is a diagram showing the coordinate system used to describe the memory device and other parts of this patent. This diagram also shows the X-ray diffraction geometry.
Figure 11:
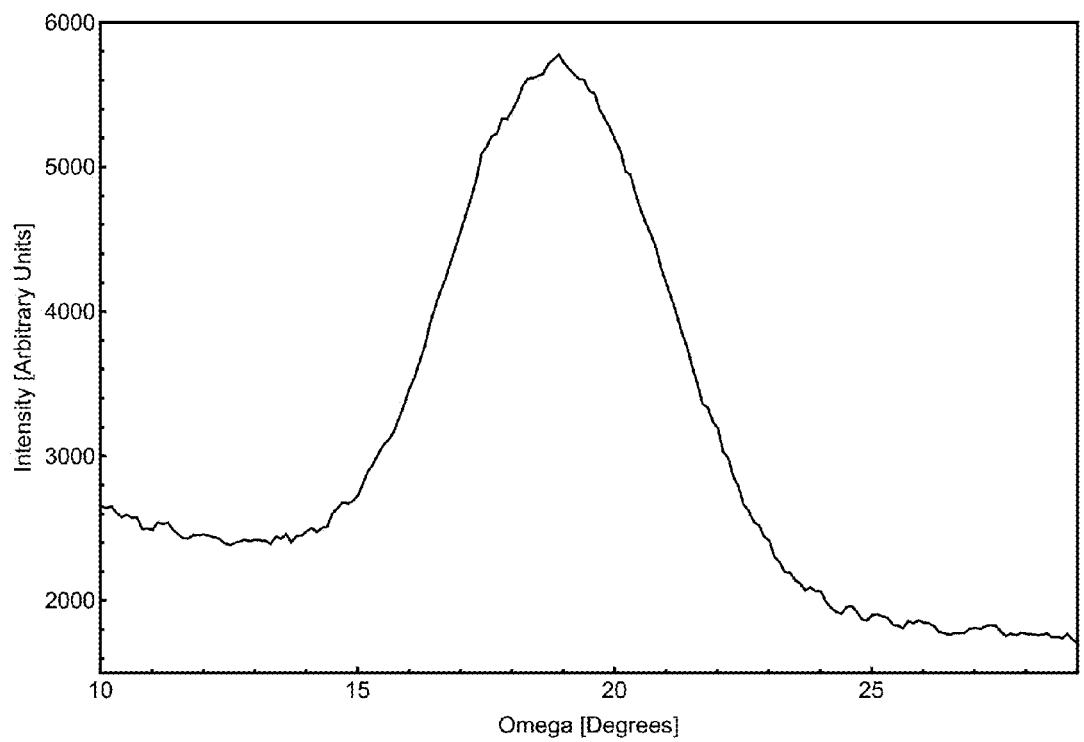
FIG. 11 is a graph of experimental rocking curve x-ray diffraction (XFD) data of the <0001> peak of a lithium niobate layer deposited on top of $Co_{63}Ru_{37}$ alloy layer growing preferentially along the <0001> crystallographic directions.
Figure 12:
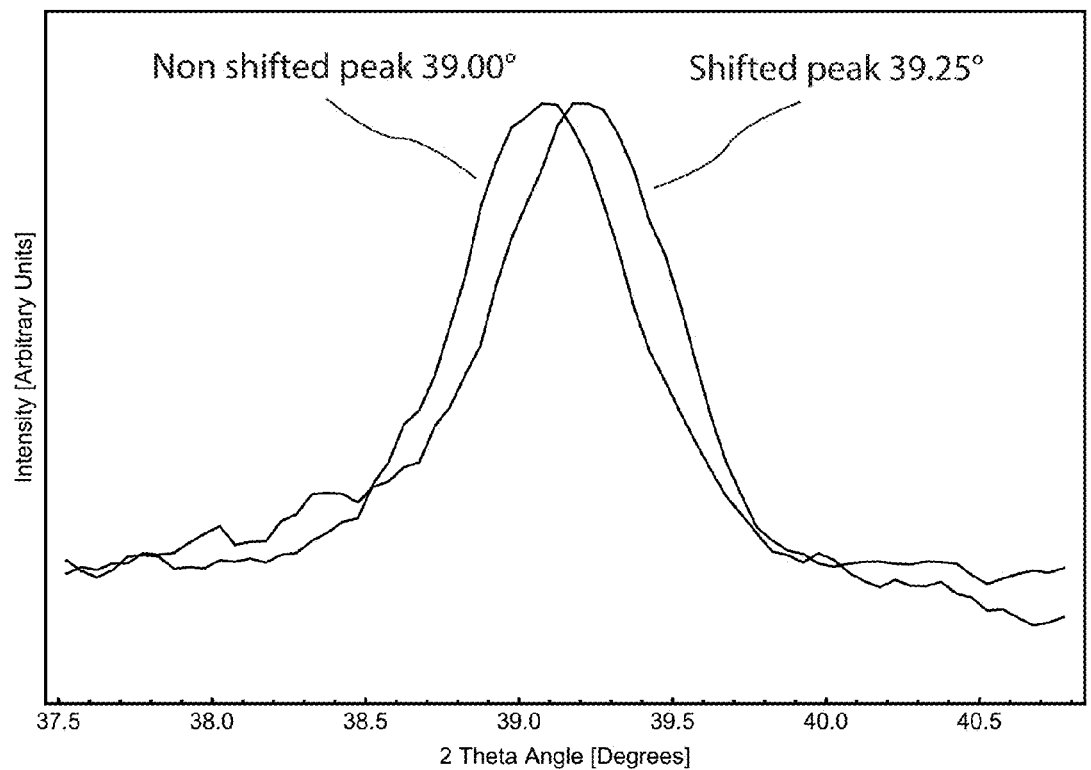
FIG. 12 is a graph of experimental data of the θ-2θ XFD scans of the strained and un-strained <0001> peak of a lithium niobate layer deposited on top of <0001> oriented CoRu alloys layer (CoRu layer grows preferentially along the <0001> crystallographic directions) with differing lattice spacing.
Figure 13:
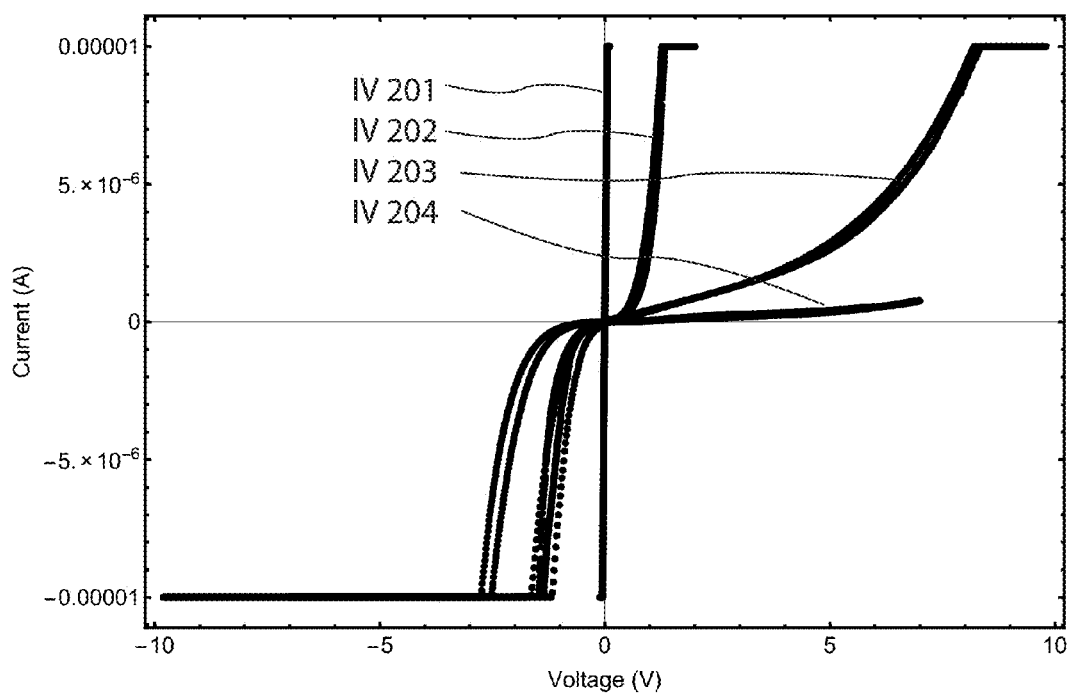
FIG. 13 is a graph of experimental data showing 4 different IV curves of the memory cell in the present invention that correspond to 4 different metal materials used in layer 101 to illustrate how the width of a Schottky barrier within the ferroelectric layer 13 can be changed.

The memory cell in the present invention can have information written to it by setting the direction and magnitude of the ferroelectric polarization to a level as shown in FIG. 14 that corresponds to the binary information being saved. This is done by applying a specific voltage to the top (12B) and bottom (12A) electrodes. This voltage is known as the writing voltage. Applying this voltage to the electrodes will create an electric field within the ferroelectric layer. The electric field that fully polarizes the ferroelectric corresponds to position E1 or E2 (or greater) in the hysteresis loop shown in FIG. 6. Once the ferroelectric layer is polarized, the applied voltage on the electrodes can be removed, and the ferroelectric layer will retain its polarization, thus saving the information to the memory device. The remaining polarization after the electric field is removed is shown as position P1 or P2 in the hysteresis loop shown in FIG. 6. In order to polarize the ferroelectric to a smaller magnitude, to hold more than one bit of information, an electric field slightly less than that of E1 can be applied. This smaller P-E loop is also shown in FIG. 6. When this slightly smaller electric field is applied, it will allow the ferroelectric to retain a polarization that is slightly less than that of full polarization. This technique can be used to achieve a large range of remnant polarizations in the ferroelectric layer.

The magnitude of voltage required to create an electric field E1, and thus achieve 100% polarization can vary significantly due to many factors, which include the thickness of the ferroelectric layer and any additional electric fields within the material. FIG. 6 shows the dependence of the ferroelectric polarization P on the applied electric field E that creates a hysteresis loop.

Reading

Figure 15:
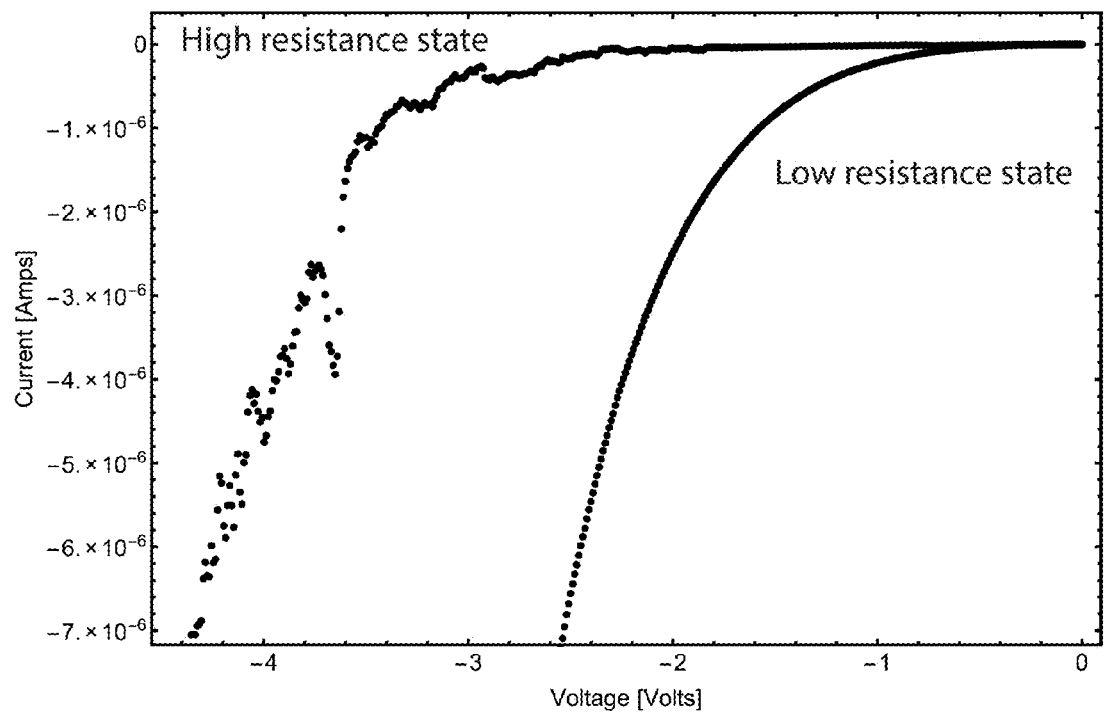
FIG. 15 Experimental data of IV curves of one possible configuration of the memory device in the present invention showing the difference between the low resistance and high resistance state.

The information is read from the memory cells in the present invention by applying a voltage smaller than the writing voltage to the electrodes 12A and 12B in FIG. 1 to FIG. 5 (we call this voltage the reading voltage) and measuring the current through the device. The resistance can then be calculated using Ohms law. The reading voltage must be small enough that it doesn't significantly change the polarization of the ferroelectric layer. (A larger voltage can be used to read, but the memory cell would have to have information re-written after reading). The resistance as measured by applying the reading voltage is dependent on the polarization of the ferroelectric layer. For example, if the ferroelectric layer is negatively polarized at −POL, the resistance may be 100 KOhm, but if the ferroelectric layer is positively polarized at +POL, the resistance may be 100 MOhm. If this is the case, then polarization magnitudes between −POL and +POL will have resistances in between 100 KOhm and 100 MOhm. Therefore, by measuring the resistance, it is possible to determine the orientation and magnitude of the polarization in the ferroelectric layer, which in turn can be used to determine the saved binary information. FIG. 15 shows IV (current voltage) curve data of the memory cell in the present invention in the high resistance state and the low resistance state. FIG. 15 clearly shows the difference in the IV curves and resistances that occurs when the polarization of the ferroelectric layer is changed.

Figure 20:
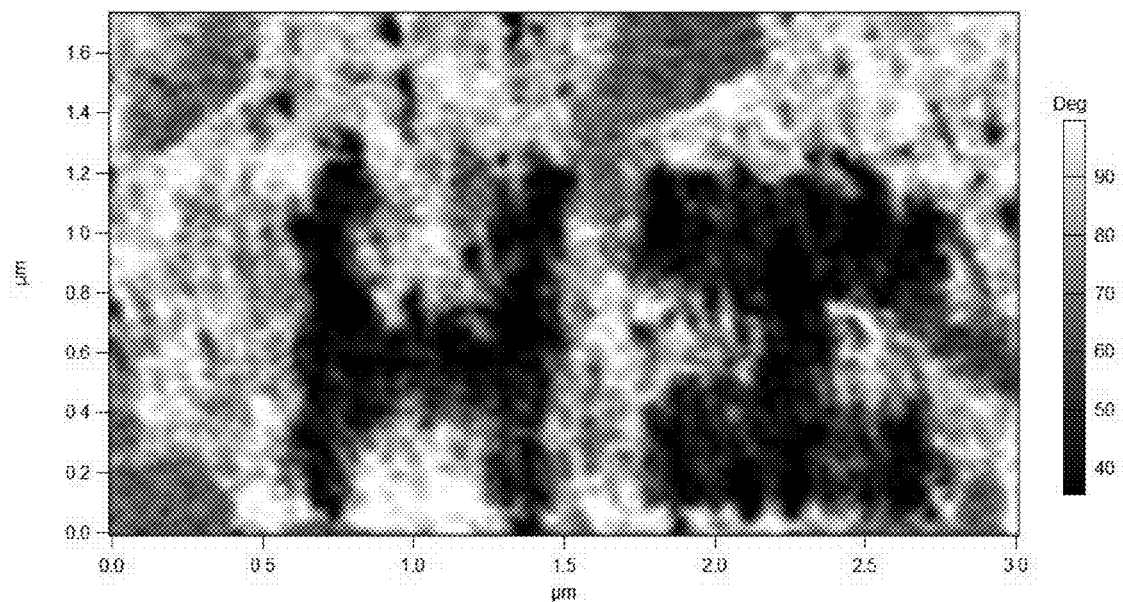
FIG. 20 is experimental data of a PFM phase image of the surface of a 17 nm lithium niobate layer grown on $Ta/Co_{63}Ru_{37}$. The word "HI" was previously written into the ferroelectric polarization by switching the polarization of the ferroelectric under the word "HI".
Figure 21:
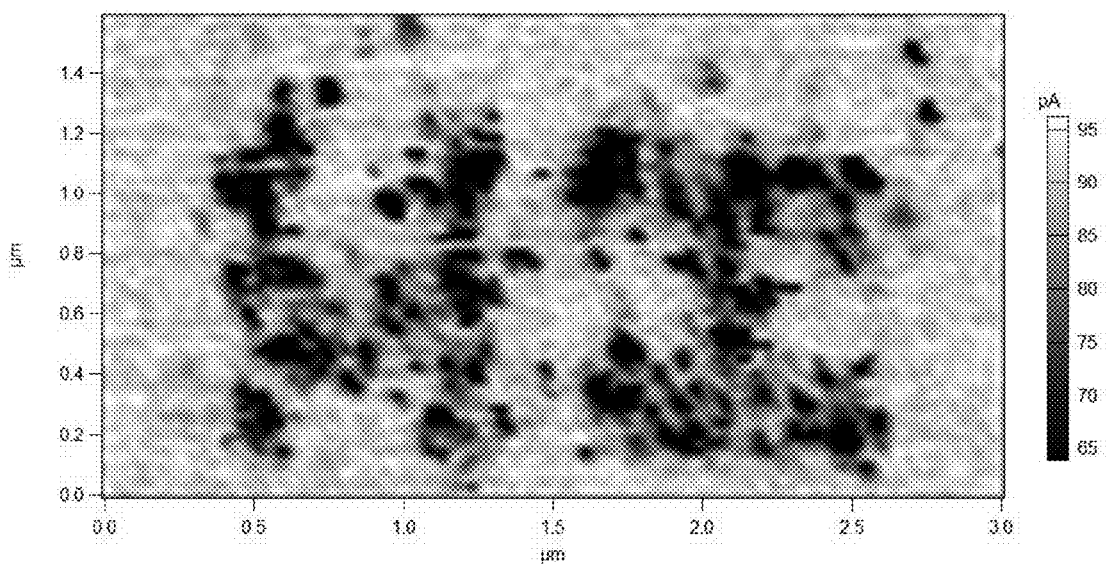
FIG. 21 is experimental data of a conductive atomic force microscopy (CAFM) image of the same sample as in FIG. 20. The word "HI" can now be seen as a change in resistance caused by the change in direction of polarization of the ferroelectric layer.

FIG. 21 also shows that the resistance through the ferroelectric layer is dependent on the direction of polarization of the ferroelectric layer. FIG. 21 is a conductive atomic force microscopy (CAFM) image of the same sample as seen in FIG. 20, where the AFM tip was held at a fixed voltage. The word "HI" was previously written into the ferroelectric polarization direction by switching the polarization of the ferroelectric material under the word "HI", which is also clearly visible as a change in the amount of current and resistance.

First Embodiment

Figure 1:
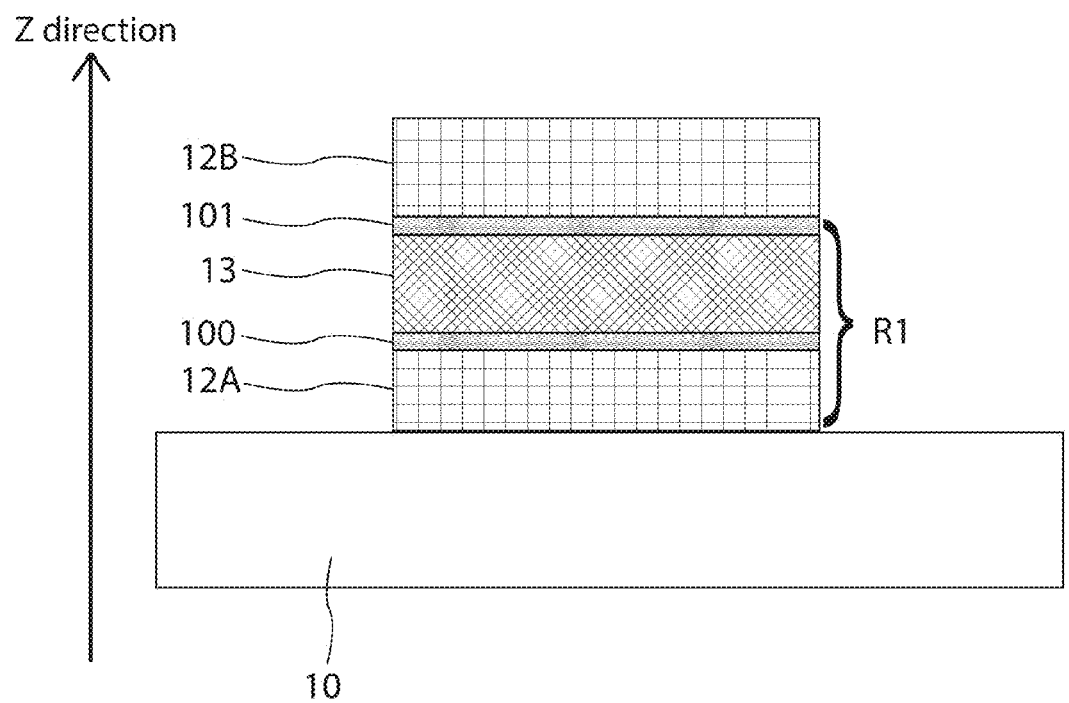
FIG. 1 is a diagram showing the construction of the ferroelectric memory device according to the first embodiment of the present invention.

FIG. 1 shows the construction of a ferroelectric memory device according to the first embodiment of the present invention.

Going from bottom to top, the first embodiment consists of a substrate 10, a bottom electrode 12A, a Schottky modulating interlayer 100, a ferroelectric layer 13, a Schottky modulating interlayer 101, and a top electrode 12B. The present embodiment also contains a section of layers labeled R1, which can be repeated n times where n is any number from 0 to infinity.

The substrate layer 10 acts as a platform to grow the rest of the structure on top of. The substrate layer generally consists of undoped silicon, or N or P doped silicon. The substrate layer can also consist of an electronic layer containing transistors with a bit and word line to select single memory cells. In this case, the memory cell will sit above the transistors in such a way as to allow current and voltage to be sent to a single memory cell without disturbing the others. The substrate layer 10 can also contain lines of conducting material separated in the plane with insulating material. In the this case, the memory cell will sit on top of one of the conducting lines, and above the memory cell will be more conducting lines separated by each other with insulating material that run in the plane of the sample and in a direction that is not parallel to the conducting lines below the memory cell. This configuration is commonly known as a crossbar array. Furthermore, the substrate can contain anything that allows a single memory cell to be written to and read from without disturbing any other memory cells.

The role of the bottom electrode 12A is to establish electrical contact and induce and maintain texture and epitaxial growth of ferroelectric and semiconductor layers throughout the structure. The bottom electrode must also have good adhesion with the substrate below it.

The bottom electrode may contain one or more layers consisting of at least one element from the following group: B, C, Al, Ti, V, Cr, Mn, Fe, Co, Ni, Cu, Zr, Nb, Mo, Ru, Re, Rh, Pd, Ag, Hf, Ta, W, Ir, Pt, Au, Mo, CrTa, $Co_xRu_{1-x}$ where $0<x<1$, $Cr_xRu_{1-x}$ where $0<x<0.4$, $Au_xNi_{1-x}$ where $0<x<1$, $Co_xP_{1-x}$ where $0<x<1$, $Ni_xPt_{1-x}$ where $0<x<1$, $Ni_xIr_{1-x}$ where $0<x<1$, $Co_xPe_{1-x}$ where $0<x<1$ $Pd_xPt_{x-1}$ where $0<x<1$, or an alloy of two or more of any of these materials.

Further, the bottom electrodes may also contain one or more oxide, nitride, semiconductor, or insulator layer like MgO, SrTiO3, LaNiO3, SrRuO3, $La_{0.7}Sr_{0.3}MnO_3$, $La_{0.5}Ca_{0.5}MnO_3$, Si, GaN or the oxide or nitride of any of the metals in the bottom electrode such as $RuO_2$, $RuO_4$, CoRuO, $CoRuO_2$, $Al_2O_3$, BN etc. . . .

The materials in the bottom electrode 12A may be amorphous, polycrystalline, or crystalline. If the materials are crystalline or polycrystalline, the crystal lattice may be oriented in a preferred direction. As described earlier in this patent, the ferroelectric layer must have a specific crystal structure orientation that allows some component of the remnant polarization to be in the Z direction. The specific orientation is different for all ferroelectrics and depends on the one that is being used in the device. One way of achieving this is to create a lattice matched underlayer. In this case the underlayer would be the uppermost layer within the bottom electrode 12A.

The crystal system and orientation of the bottom electrode required to match the lattice of the ferroelectric depends on the crystal system of the ferroelectric. All crystal systems can be lattice matched with the same crystal system. For example, 1) if the ferroelectric has the body-centered cubic (bcc) crystal system, then it can be lattice matched with another bcc material. 2) Most perovskite crystal structures can be lattice matched with <001> fcc materials. 3) hcp <0001> ferroelectrics, like lithium niobate, can be lattice matched with fcc <111> or hcp <0001> materials. So once the ferroelectric of choice is decided (from the list of ferroelectrics in the description of layer 13). Determine its ferroelectric crystal system and orientation that maximizes remnant polarization in the z-direction, then choose one of the following crystal structures that will be lattice matched (based on atomic spacing in the plane): <0001> hcp, <110> bcc, <111> fcc, <001> fcc, <001> bcc. Finally, the following section will describe exactly how to create a bottom electrode with the crystal system and orientation needed to lattice match the ferroelectric of choice.

Figure 22:
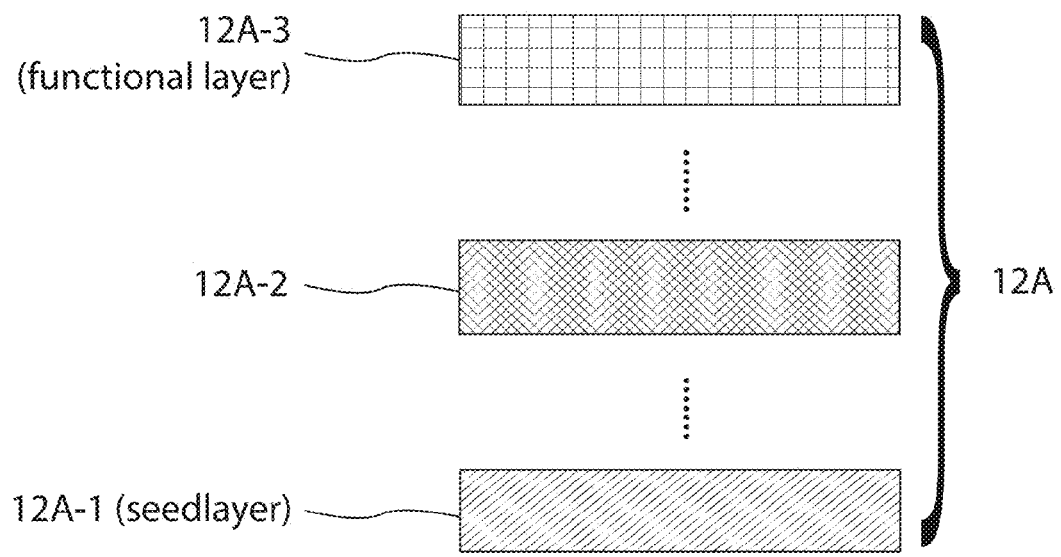
FIG. 22 shows the names of the different sections of layers within the bottom electrode.

FIG. 22 shows a bottom electrode that contains 3 distinct sections: 12A-1, 12A-2, and 12A-3. The bottom electrode can consist of one of the three sections, two of the three sections, or all three of the three sections. Each section can also contain one or more layers.

Section 12A-1, also known as the seedlayer, creates good adhesion to the substrate below. It also creates a uniform platform on which to grow the rest of the structure. The seedlayer comprises at least one element from the group consisting of B, C, Ti, Cr, Mn, Co, Fe, Ni, Zr, Nb, Mo, Hf, Ta, and W. Layer 12A-1 may be 1 or more layers of any combination of these elements. Experimental XFD θ-2θ scan data of a 6 nm, 10 nm, 16 nm, and 20 nm Ta seedlayer is displayed in FIG. 23. The data shows a presence of two crystal structures in the 20 nm Ta layer: 1) Beta-Ta crystal structure that grows preferentially along <002> crystal directions, and 2) body center cubic (bcc) alpha-Ta bcc crystal structure that grows preferentially along <110> crystal directions.

Section 12A-2 is grown on top of section 12A-1 and will have its crystal structure oriented in a desired direction. 12A-2 comprises at least one element from the group consisting of V, Cr, Ni, Fe, Co, Cu, Mo, Ru, Re, Rh, Pd, Ag, W, Ir, Pt, Au. Layer 12A-2 may be 1 or more layers of any combination of these elements. The combination of the seed layer 12A10, and the underlayer 12A20 is used to establish growth of: 1) hcp structure along <0001> crystal directions, 2) fcc structure along <111> crystal directions, 3) bcc structure along <110> crystal directions, and 4) fcc and bcc structure along <001> crystal directions.

Combinations of materials that sections 12A-1 and 12A-2 can be comprised of in order to establish growth of hcp structure along <0001> crystal directions: (Also called bottom electrode crystallographic orientation recipes)

1) The seedlayer 12A-1 comprises one or more layers of at least one metallic material (including alloys) selected from the group consisting of Ta, Nb, Mo, W,
   $Ta_{1-x-y-z-i-j}Cr_xCo_yFe_zNi_iV_j$ ($0<x+y+z+i+j<0.85$),
   $Mo_{1-x-y-z-i-j}Cr_xCo_yFe_zNi_iV_j$ ($0<x+y+z+i+j<0.85$),
   $Nb_{1-x-y-z-i-j}Cr_xCo_yFe_zNi_iV_j$ ($0<x+y+z+i+j<0.85$),
   $W_{1-x-y-z-i-j}Cr_xCo_yFe_zNi_iV_j$ ($0<x+y+z+i+j<0.85$),
   $Zr_{1-x-y-z-i-j}Cr_xCo_yFe_zNi_iV_j$ ($0<x+y+z+i+j<0.85$),
   $Hf_{1-x-y-z-i-j}Cr_xCo_yFe_zNi_iV_j$ ($0<x+y+z+i+j<0.85$), (any combination of $Fe,Co,Ni,V,Cr)_{1-x}$(any combination of $B,C,Si,P)_x$ ($0.1<x<0.4$) example: $Fe_{0.4}Co_{0.4}B_{02}$ or $Fe_{0.3}Co_{0.6}B_{0.2}$, 2) Section 12A-2 comprises one or more layers of at least one metallic material (including alloys) selected from the group consisting of Ru, Co, Re, $Ru_{1-x}Co_x$ ($0<x<1$), $Fe_xRu_{1-x}$ ($0<x<0.70$), $Ni_xRu_{1-x}$ ($0<x<0.45$), $Mo_xRu_{1-x}$ ($0<x<0.5$), $W_xRu_{1-x}$ ($0<x<0.33$), $Mo_xRu_{1-x}$ ($0<x<0.5$), $Fe_xCo_{1-x}$ ($0<x<0.5$), $Co_xRu_yRe_zRh_iNi_jCr_kPt_{1-x-y-z-i-j-k}$ ($0.55<x+y+z<1$).

Combinations of materials that sections 12A-1 and 12A-2 can be comprised of in order to establish growth of fcc structure along <111> crystal directions:

1) The seedlayer 12A-1 comprises one or more layers of at least one metallic material (including alloys) selected from the group consisting of Ta, Nb, Mo, W,
   $Ta_{1-x-y-z-i-j}Cr_xCo_yFe_zNi_iV_j$ ($0<x+y+z+i+j<0.85$),
   $Mo_{1-x-y-z-i-j}Cr_xCo_yFe_zNi_iV_j$ ($0<x+y+z+i+j<0.85$),
   $Nb_{1-x-y-z-i-j}Cr_xCo_yFe_zNi_iV_j$ ($0<x+y+z+i+j<0.85$),
   $W_{1-x-y-z-i-j}Cr_xCo_yFe_zNi_iV_j$ ($0<x+y+z+i+j<0.85$),
   $Zr_{1-x-y-z-i-j}Cr_xCo_yFe_zNi_iV_j$ ($0<x+y+z+i+j<0.85$),
   $Hf_{1-x-y-z-i-j}Cr_xCo_yFe_zNi_iV_j$ ($0<x+y+z+i+j<0.85$), (any combination of $Fe,Co,Ni,V,Cr)_{1-x}$(any combination of $B,C,Si,P)_x$ ($0.1<x<0.4$) example: $Fe_{0.4}Co_{0.4}B_{02}$ or $Fe_{0.3}Co_{0.6}B_{0.2}$, 2) Section 12A-2 comprises one or more layers of at least one metallic material (including alloys) selected from the group consisting of Ir, Rh, Pd, Pt, Au, Cu, Ag, IrRh, $Pd_xPt_yAu_zAg_{1-x-y-z}$ ($0<x+y+z<1$), $Pt_xRu_{1-x}$ ($0<x<0.45$), $Ir_xRu_{1-x}$ ($0<x<0.30$), $Fe_xNi_{1-x}$ ($0<x<0.8$), PdPtNi, $Ru_xPt_{1-x}$ ($0<x<0.46$), Combinations of materials that sections 12A-1 and 12A-2 can be comprised of in order to establish growth of bcc structure along <110> crystal directions:

1) The seedlayer 12A-1 comprises one or more layers of at least one metallic material (including alloys) selected from the group consisting of Ta, Nb, Mo, W,
   $Ta_{1-x-y-z-i-j}Cr_xCo_yFe_zNi_iV_j$ ($0<x+y+z+i+j<0.85$),
   $Mo_{1-x-y-z-i-j}Cr_xCo_yFe_zNi_iV_j$ ($0<x+y+z+i+j<0.85$),
   $Nb_{1-x-y-z-i-j}Cr_xCo_yFe_zNi_iV_j$ ($0<x+y+z+i+j<0.85$),
   $W_{1-x-y-z-i-j}Cr_xCo_yFe_zNi_iV_j$ ($0<x+y+z+i+j<0.85$),
   $Zr_{1-x-y-z-i-j}Cr_xCo_yFe_zNi_iV_j$ ($0<x+y+z+i+j<0.85$),
   $Hf_{1-x-y-z-i-j}Cr_xCo_yFe_zNi_iV_j$ ($0<x+y+z+i+j<0.85$), (any combination of $Fe,Co,Ni,V,Cr)_{1-x}$(any combination of $B,C,Si,P)_x$ ($0.1<x<0.4$) example: $Fe_{0.4}Co_{0.4}B_{02}$ or $Fe_{0.3}Co_{0.6}B_{0.2}$, 2) Section 12A-2 comprises one or more layers of at least one metallic material (including alloys) selected from the group consisting of Nb, Mo, Ta, W, V, Cr, Mn, Fe.

Combinations of materials that sections 12A-1 and 12A-2 can be comprised of in order to establish growth of fcc structure along <001> crystal directions:

1) The seedlayer 12A-1 comprises one or more layers of at least one metallic material (including alloys) selected from the group consisting of Ta, Nb, Mo, W,
   $Ta_{1-x-y-z-i-j}Cr_xCo_yFe_zNi_iV_j$ ($0<x+y+z+i+j<0.85$),
   $Mo_{1-x-y-z-i-j}Cr_xCo_yFe_zNi_iV_j$ ($0<x+y+z+i+j<0.85$),
   $Nb_{1-x-y-z-i-j}Cr_xCo_yFe_zNi_iV_j$ ($0<x+y+z+i+j<0.85$),
   $W_{1-x-y-z-i-j}Cr_xCo_yFe_zNi_iV_j$ ($0<x+y+z+i+j<0.85$),
   $Zr_{1-x-y-z-i-j}Cr_xCo_yFe_zNi_iV_j$ ($0<x+y+z+i+j<0.85$),
   $Hf_{1-x-y-z-i-j}Cr_xCo_yFe_zNi_iV_j$ ($0<x+y+z+i+j<0.85$), (any combination of $Fe,Co,Ni,V,Cr)_{1-x}$(any combination of $B,C,Si,P)_x$ ($0.1<x<0.4$) example: $Fe_{0.4}Co_{0.4}B_{02}$ or $Fe_{0.3}Co_{0.6}B_{0.2}$, 2) Section 12A-2 comprises a first layer with at least one material (including alloys) selected from the group consisting of MgO, $Ru_xCr_{1-x}$ ($0<x<0.4$), with an optional second layer comprised at least one of one material from the following group consisting of Ir, Rh, Pd, Pt, Au, Cu, Ag, IrRh, $Pd_xPt_yAu_zAg_{1-x-y-z}$ ($0<x+y+z<1$), $Pt_xRu_{1-x}$ ($0<x<0.45$), $Ir_xRu_{1-x}$ ($0<x<0.30$), $Fe_xNi_{1-x}$ ($0<x<0.8$), PdPtNi, $Ru_xPt_{1-x}$ ($0<x<0.46$), Combinations of materials that sections 12A-1 and 12A-2 can be comprised of in order to establish growth of bcc structure along <001> crystal directions:

1) The seedlayer 12A-1 comprises one or more layers of at least one metallic material (including alloys) selected from the group consisting of Ta, Nb, Mo, W,
   $Ta_{1-x-y-z-i-j}Cr_xCo_yFe_zNi_iV_j$ ($0<x+y+z+i+j<0.85$),
   $Mo_{1-x-y-z-i-j}Cr_xCo_yFe_zNi_iV_j$ ($0<x+y+z+i+j<0.85$),
   $Nb_{1-x-y-z-i-j}Cr_xCo_yFe_zNi_iV_j$ ($0<x+y+z+i+j<0.85$),
   $W_{1-x-y-z-i-j}Cr_xCo_yFe_zNi_iV_j$ ($0<x+y+z+i+j<0.85$),
   $Zr_{1-x-y-z-i-j}Cr_xCo_yFe_zNi_iV_j$ ($0<x+y+z+i+j<0.85$),
   $Hf_{1-x-y-z-i-j}Cr_xCo_yFe_zNi_iV_j$ ($0<x+y+z+i+j<0.85$), (any combination of $Fe,Co,Ni,V,Cr)_{1-x}$(any combination of $B,C,Si,P)_x$ ($0.1<x<0.4$) example: $Fe_{0.4}Co_{0.4}B_{02}$ or $Fe_{0.3}Co_{0.6}B_{0.2}$, 2) Section 12A-2 comprises a first layer with at least one material (including alloys) selected from the group consisting of MgO, $Ru_xCr_{1-x}$ (0<x<0.4), with an optional second layer comprised at least one of one material from the following group consisting of Nb, Mo, Ta, W, V, Cr, Mn, Fe.

The above combinations of materials to establish growth are not exhaustive lists. Other combinations of materials exist that can also establish growth of desired crystal directions. Furthermore, the subscripts in the chemical formulas are ratios between atoms in the formula so that $Fe_{60}Co_{20}B_{20}$ is equivalent to $Fe_{0.6}Co_{0.2}B_{0.2}$.

Figure 24:
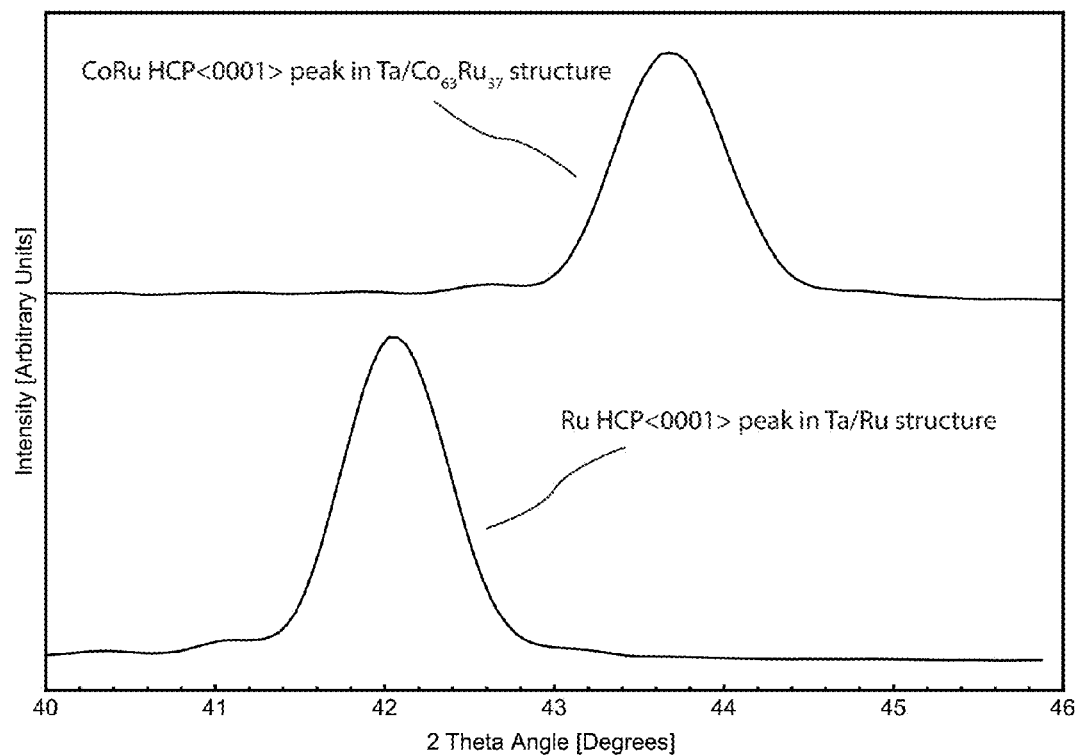
FIG. 24 is a graph of experimental data of two θ-2θ XFD scans of $Ta/Co_{63}Ru_{37}$ and Ta/Ru bottom electrode structures, showing that the top layers are hcp <0001> oriented.

FIG. 24 shows experimental XFD θ-2θ scan data of $Ta/Co_{63}Ru_{37}$ and Ta/Ru bottom electrode structures. Both $Co_{63}Ru_{37}$ and Ru layers have hcp crystal structure and grow along <0001> crystal orientations on top of Ta seedlayer.

Figure 25:
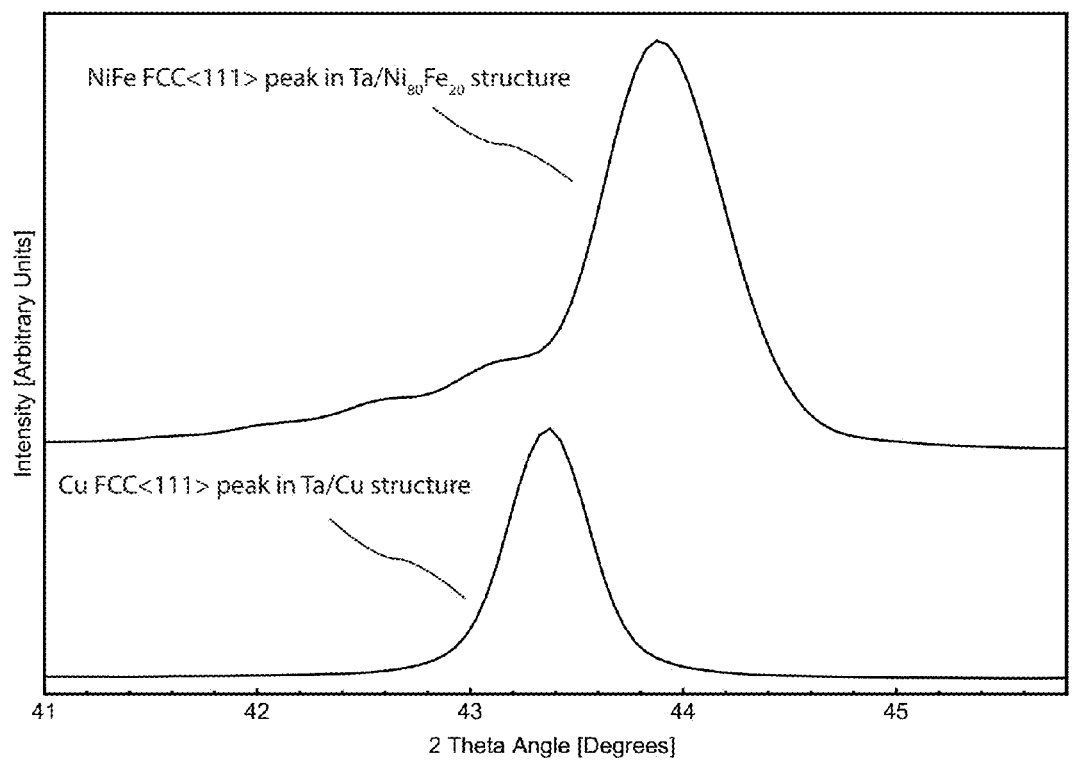
FIG. 25 is a graph of experimental data of two θ-2θ XFD scans of $Ta/Ni_{80}Fe_{20}$ and Ta/Cu bottom electrode structures, showing that the top layers are fcc <111> oriented.

FIG. 25 shows experimental XFD θ-2θ scan data of $Ta/Ni_{80}Fe_{20}$ and Ta/Cu bottom electrode structures. Both $Ni_{80}Fe_{20}$ and Cu layers have fcc crystal structure and grow along <111> crystal orientations on top of Ta seedlayer.

Figure 26:
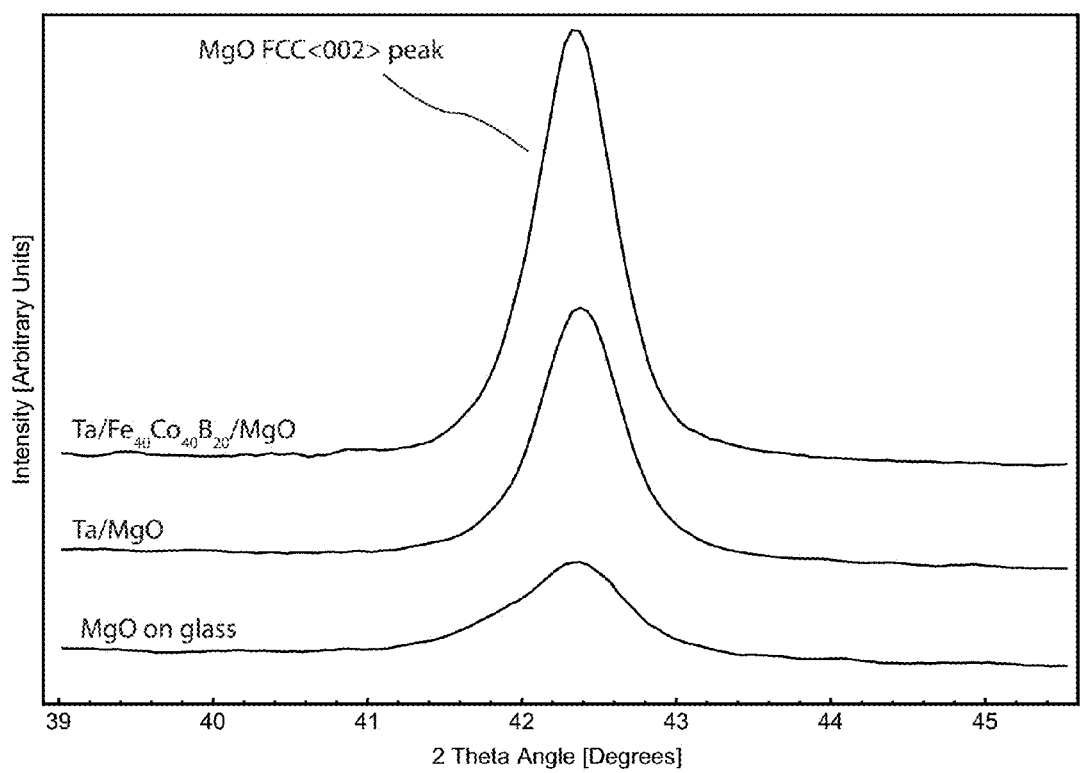
FIG. 26 is a graph of experimental data of two θ-2θ XFD scans of MgO on glass, Ta/MgO, and $Ta/Fe_{40}Co_{40}B_{20}$/MgO, showing that the MgO layer can be well oriented in the fcc <001> direction when grown using the procedure in this patent.

FIG. 26 shows experimental XFD θ-2θ scan data of MgO on glass, Ta/MgO, and $Ta/Fe_{40}Co_{40}B_{20}/MgO$. In all three cases, the MgO layer is the same thickness. The larger peak indicates that the MgO layer is better oriented along the fcc <001> direction.

Section 12A-2 may also be a combination of different materials with different crystal lattice structures to improve alignment further. Here are some combinations of different crystal structures that can be lattice matched and grown on top of each other in section 12A-2:
1) Section 12A-2 consists of one or more layers where at least one layer has fcc crystal structure and grows preferentially along <111> crystal orientations, and at least one layer has hcp crystal structure and grows preferentially along <0001> crystal orientations.
2) Section 12A-2 consists of one or more layers where at least one layer has bcc crystal structure and grows preferentially along <110> crystal orientations, and at least one layer has hcp crystal structure and grows preferentially along <0001> crystal orientations.
3) Section 12A-2 consists of one or more layers where at least one layer has bcc crystal structure and grows preferentially along <110> crystal orientations, and at least one layer has fcc crystal structure and grows preferentially along <111> crystal orientations.
4) Section 12A-2 consists of one or more layers where at least one layer has bcc crystal structure and grows preferentially along <110> crystal orientations, at least one layer has fcc crystal structure and grows preferentially along <111> crystal orientations, and at least one layer has hcp crystal structure and grows preferentially along <0001> crystal orientations.

Figure 27:
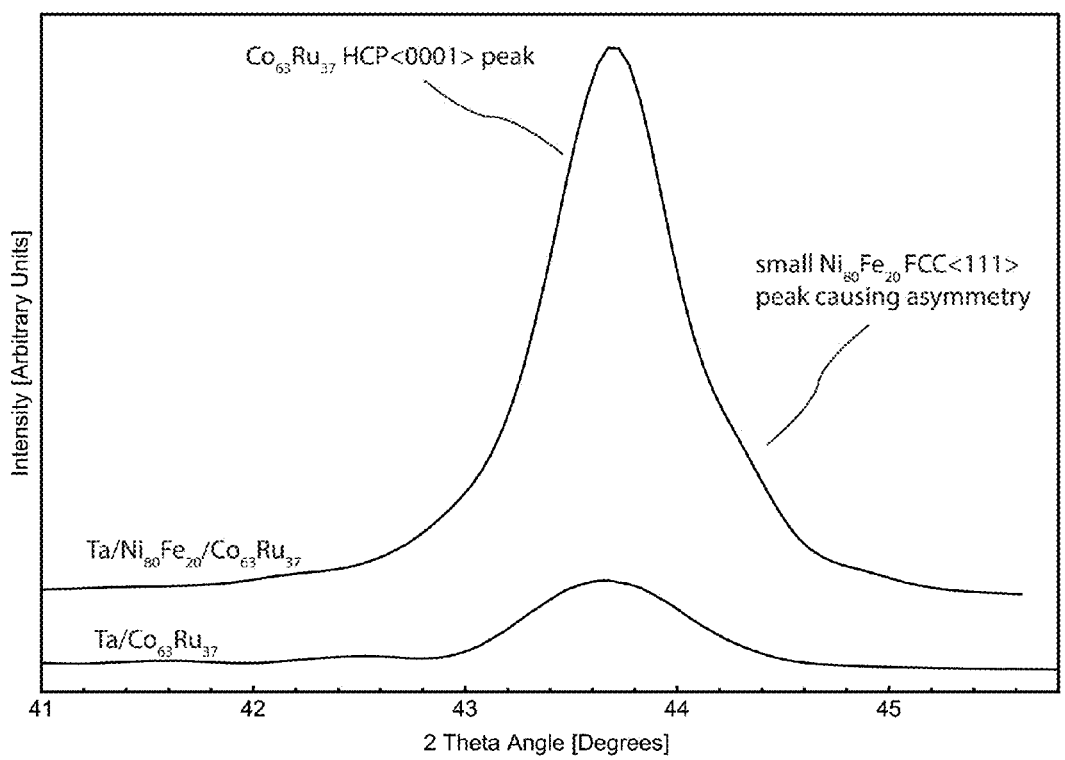
FIG. 27 is a graph of experimental data of two θ-2θ XFD scans of $Ta/Co_{63}Ru_{37}$ and $Ta/Ni_{80}Fe_{20}/Co_{63}Ru_{37}$ bottom electrode structures, showing that combinations of different crystal systems can be lattice matched and grown well oriented on top of each other.
Figure 28:
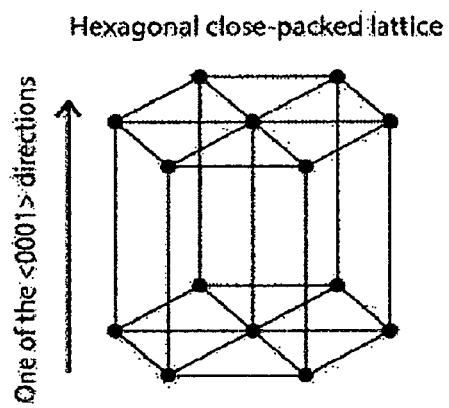
FIG. 28 is a diagram of the hexagonal close-packed lattice showing one of the <0001> directions. The <0001> directions also include all equivalent directions by virtue of the crystal symmetry.
Figure 29:
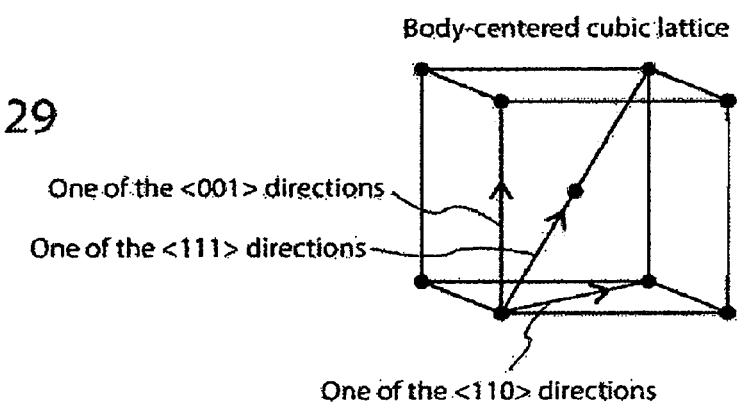
FIG. 29 is a diagram of the body-centered cubic lattice showing one of the <001> directions, one of the <111> directions, and one of the <110> directions. Each of these <001>, <111>, <110> directions also include all equivalent directions by virtue of the crystal symmetry.
Figure 30:
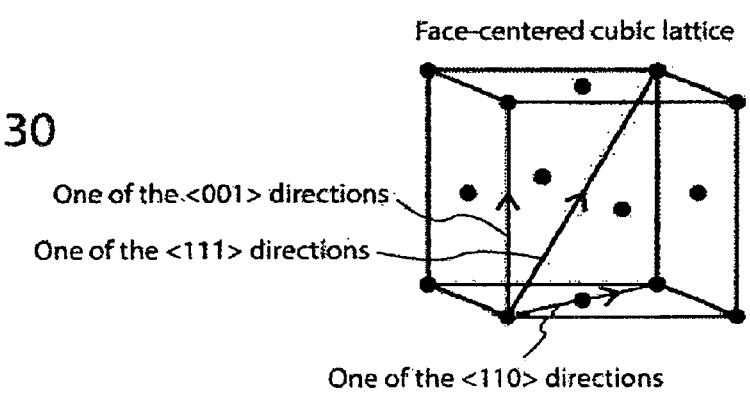
FIG. 30 is a diagram of the face-centered cubic lattice showing one of the <001> directions, one of the <111> directions, and one of the <110> directions. Each of these <001>, <111>, <110> directions also include all equivalent directions by virtue of the crystal symmetry.
Figure 31:
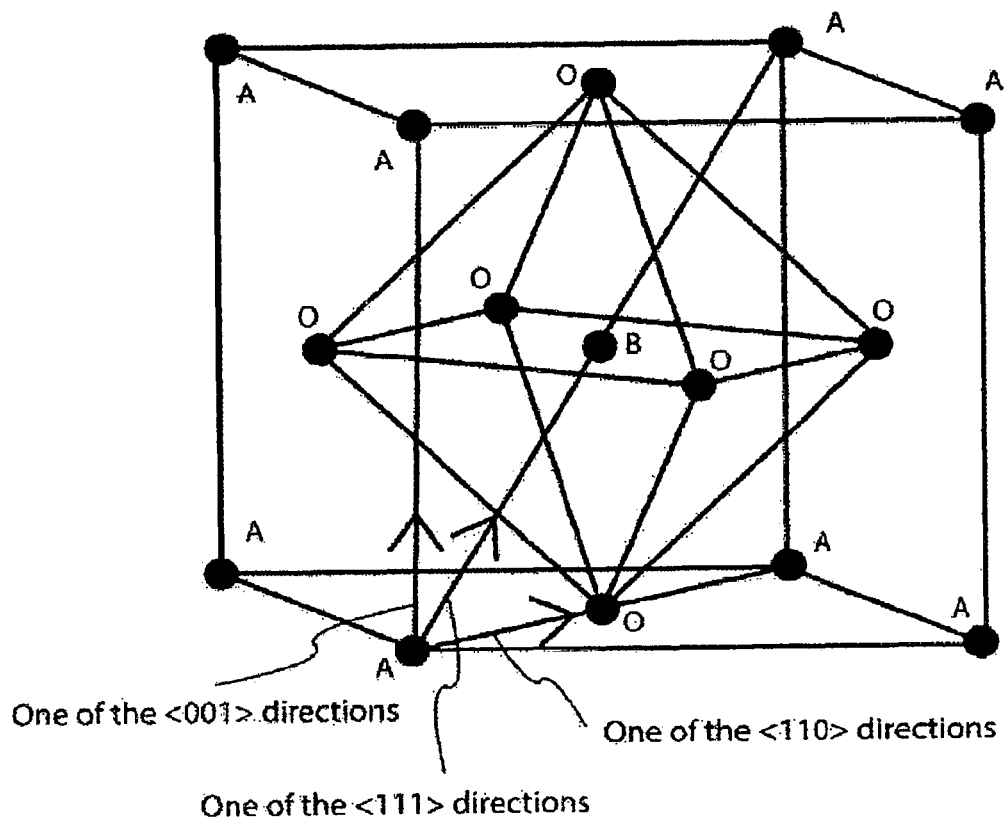
FIG. 31 is a diagram of the perovskite crystal structure and lattice showing one of the <001> directions, one of the <111> directions, and one of the <110> directions. Each of these <001>, <111>, <110> directions also include all equivalent directions by virtue of the crystal symmetry. This diagram also shows the position of each of the atoms from the ABO3 chemical formula which is common for all perovskite materials.

FIG. 27 shows experimental XFD θ-2θ scan data of $Ta/Co_{63}Ru_{37}$ and $Ta/Ni_{80}Fe_{20}/Co_{63}Ru_{37}$ bottom electrode structures. $Ni_{80}Fe_{20}$ has fcc crystal structure and grows along <111> crystal orientations, and $Co_{63}R_{37}$ has hcp crystal structure and grows along <0001> crystal orientations. Since the two structures are approximately lattice matched, the orientation of the $Co_{63}Ru_{37}$ layer is improved.

Further, section 12A-3, also known as the functional layer is grown on top of section 12A-2. The functional layer can be: 1) metallic, 2) metallic and magnetic, 3) semiconductor, 4) oxide semiconductor, and 5) oxide 6) conductive oxide. Layer 12A-3 may be 1 or more layers of any combination of these materials (including alloys). This layers role is to add functionality to the device, or improve the properties of the device.

Further, as mentioned, some of the materials used in the layers 12A-2, can be alloyed with other materials within the same layer 12A-2, within the same bottom electrode crystallographic orientation recipe, in order to expand or contract the lattice spacing to achieve even better lattice match with the ferroelectric. For example: The $Co_{20}Ru_{80}$ alloy has a <002> plane spacing of 2.05 Angstroms, while the $Co_{50}Ru_{50}$ alloy has a <002> plane spacing of 2.08 Angstroms. If alloying is used with materials within the same 12-A layer within the same bottom electrode crystallographic orientation recipe in this patent, then the alloy will most likely still become crystallographically oriented into the direction that the recipe predicts.

FIG. 16A, 16B, 16C, 16D shows 4 examples of some of the possible, but not limiting, ways the bottom electrode may be configured.

Figure 23:
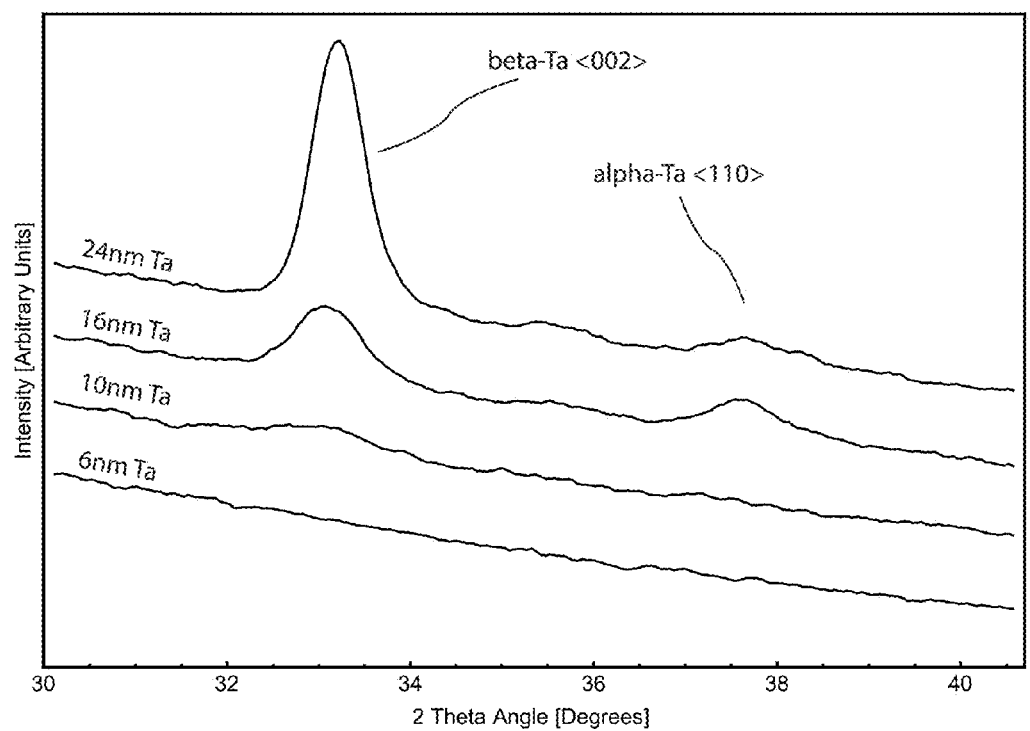
FIG. 23 is a graph of experimental data of two θ-2θ XFD scans of alpha-Ta <110> and beta-Ta <002> peaks for samples of varying Ta layer thickness.

FIG. 16A is a single layer bottom electrode. The experimental XFD θ-2θ scan data for a sample with this configuration is shown in FIG. 23. In this case, the Ta layer may be beta-Ta <002>, alpha-Ta <110>, or amorphous Ta.

FIG. 16B is a two layer bottom electrode. The experimental XFD θ-2θ scan data for a sample with this configuration is shown in FIG. 24. In this case, Ta is the same as in FIG. 16A, and CoRu is hcp <0001>.

FIG. 16C is a three layer bottom electrode. The experimental XFD θ-2θ scan data for a sample with this configuration is shown in FIG. 25. In this case, Ta is the same as in FIG. 16A, NiFe is fcc <111>, and CoRu is hcp <0001>. This is the preferred configuration. In this preferred configuration the CoRu alloy is approximately 63% Co and 37% Ru. Although these percentages may be changed in order to apply stress to the layer above.

FIG. 16D is a four layer bottom electrode. In this case, Ta is the same as in FIG. 16A, MgO is fcc <001>, Pt is fcc <001>, and SrRuO3 is perovskite <001>.

Moving on through the structure of the device, the next layers to discuss are layers 100 and 101. The role of the interlayers 100 and 101 is to modulate the Schottky barriers that can form at each side of the ferroelectric. Some materials will cause a Schottky barrier to form, while other materials will not. These layers will have a thickness ranging from 0.1 nm to 8 nm each. These layers will be thin enough so that dislocations are minimized and that they retain much of the lattice spacing set up by the layer below. These interlayers 100 and 101 can be composed of one or more layers of metals, semiconductors, oxides, or ceramics. They are also allowed to be composed of the same material as the electrode above or below it. If a metal is used, and the semiconductor creating the interface with this layer is n-type, then a large work function of the metal will cause a Schottky barrier, while a lower work function of the metal will not. The larger the work function is, the larger the Schottky barrier will be, and thus, the larger the resistance will be through the device. When the semiconductor at the interface is a p-type, then the work function of the layer 100 or 101 needs to be small to create a Schottky barrier. In this case, a large work function of the layer 100 or 101 will create an Ohmic contact. The present embodiment will function with a large range of materials in the interlayers 100 and 101, so it would be impossible to list them all. Some preferred materials to be used in layers 100 and 101 are any of the materials that the bottom electrode may consist of. These materials are listed earlier in the patent. The layers 100 or 101 can be used to create Schottky barriers on one side of the ferroelectric 13, both sides of the ferroelectric 13, or neither sides of the ferroelectric 13.

During the growth of layers with reactive components, like the oxygen in lithium niobate, the layers below may react with the reactive component being deposited above.

For example, when depositing lithium niobate on top of ruthenium, a thin or thick layer of ruthenium oxide may form at or near the interface of the two materials. This layer will form because oxygen from the lithium niobate layer will react with the ruthenium metal below.

The ferroelectric layer 13, which acts to hold information in the direction of polarization, consist of at least one ferroelectric material. The ferroelectric layer will consist of at least one layer of ferroelectric material, and may consist of multiple layers of the same or different ferroelectric material. Some examples of ferroelectric materials that can be used in layer 13 are:

Lithium Niobate ($LiNbO_3$), Sodium Niobate ($NaNbO_3$), Potassium Niobate ($KNbO_3$), any combination of Lithium Sodium Potassium Niobate ($Li_{1-x-y}Na_xK_yNbO_3$) where x, y can vary from 0 to 1 and x+y is less or equal to 1, Lithium Tantalate ($LiTaO_3$), Sodium Tantalate ($NaTaO_3$), Potassium Tantalate ($KTaO_3$), any combination of Lithium Sodium Potassium Tantalate ($Li_{1-x-y}Na_xK_yTaO_3$) where x, y can vary from 0 to 1 and x+y is less or equal to 1. Any combination of Lithium Sodium Potassium and Tantalate and Niobate ($Li_{1-x-y}Na_xK_yNb_{1-z}Ta_zO_3$) where x, y, and z can vary from 0 to 1. Barium Titanate ($BaTiO_3$), where Ba can be in part substituted with Sr and Ti with Fe. Bismuth Ferrite ($BiFeO_3$) where Bi can be in part replaced with Sr and Fe with Ta.

The atomic ratios of the constituents of any of the ferroelectric materials listed in this patent can be changed as long as the resulting material remains ferroelectric or dielectric. For example: Two common forms of lithium niobate are congruent and stoichiometric. Both forms are ferroelectric, and both forms are called Lithium Niobate ($LiNbO_3$) but the ratios of Li, Nb, and O, are slightly different from each other. The memory cell in the current invention allows for off-stoichiometric ratios of atoms in the ferroelectric layer 13.

The thickness of the ferroelectric layer 13 can range from 0.2 nm to 5000 nm. The optimum thickness range is from 1 nm to 100 nm.

Additionally, the ferroelectric layer may be doped with donor or acceptor atoms to increase or decrease available electrons in the layer.

Additionally, the ferroelectric layer must be grown in a specific crystal structure orientation that will point the remnant polarization as close to the Z direction (as shown in FIG. 1) as possible.

Additionally, the ferroelectric layer 13 can be amorphous, polycrystalline, or crystalline.

The procedure to create an oriented bottom electrode, as written in the bottom electrode crystallographic orientation recipe section, can be used to create a lattice matched bottom electrode and ferroelectric layer. Lattice matching is the technique used in this patent to orient the ferroelectric layer in the desired direction.

Further, in many cases, the ferroelectric layer will require annealing in order to improve the desired crystallographic orientation. The best temperature for annealing depends on the ferroelectric. Lithium niobate, for example, sometimes requires annealing of approximately 300-500 degrees Celsius for 20 to 30 minutes to greatly improve orientation. Other ferroelectrics may require annealing in the range of 200-700 degrees Celsius. The layer can be annealed after deposition or during deposition.

Three examples of ways to anneal and improve orientation are:
 1) A substrate 10 may be heated to at least 200° C. prior to sputtering a ferroelectric layer 13.
 2) First deposit the entire structure up to and including the ferroelectric layer 13, and then heat the substrate with the deposited layer stack to a desired temperature (usually above 200° C.).
 3) First deposit the entire structure up to and including the top electrode 12B, and then heat the substrate with the deposited layer stack to a desired temperature (usually above 200° C.).

Lithium niobate, the preferred ferroelectric to be used in layer 13, will be grown with the c-axis of the hexagonal lattice pointing into the Z direction as defined in FIG. 1-5 and FIG. 10. When lithium niobate is grown on top of <0001> oriented CoRu alloy (with 63% Co and 37% Ru), it becomes textured in the <0001> direction. This is likely due to the fact that the atomic spacing at the interface of lithium niobate and CoRu are exactly matched. This allows the <0001> lithium niobate atoms to grow directly on top of the <0001> CoRu atoms without requiring any dislocations. Even if a thin Schottky modulating layer is placed in between the bottom electrode and the ferroelectric, lithium niobate can remain textured in the <0001> direction. This occurs because layers that are thin enough will maintain the crystal structure lattice spacing of the layer below.

Layer 13 can consist of more than one ferroelectric layer. In at least one ferroelectric layer the polarization has to be preferentially oriented perpendicular to the surface of the film, along the Z direction.

Figure 17A:
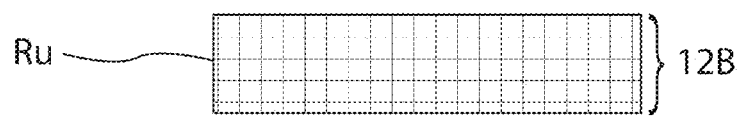
FIG. 17A, 17B, 17C are three possible but not limiting configurations of the layers within the top electrode 12B
Figure 17B:
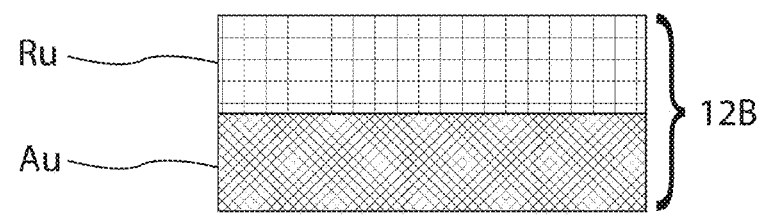
Figure 17C:
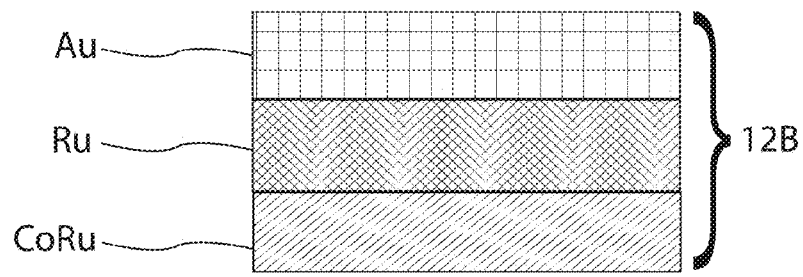
Figure 18:
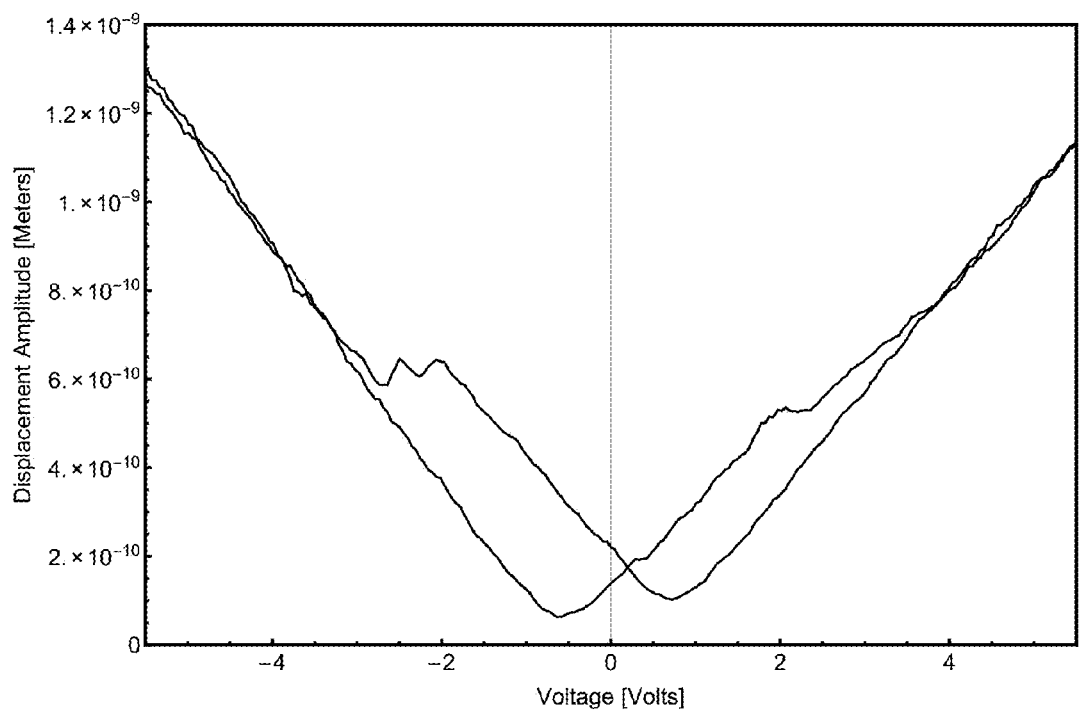
FIG. 18 is experimental data of Piezoresponse Force Microscopy (PFM) displacement-voltage hysteresis of a 17 nm lithium niobate layer grown on $Ta/Co_{63}Ru_{37}$ showing the so called butterfly loop. Displacement measured in the z direction, and voltage applied in the z direction.
Figure 19:
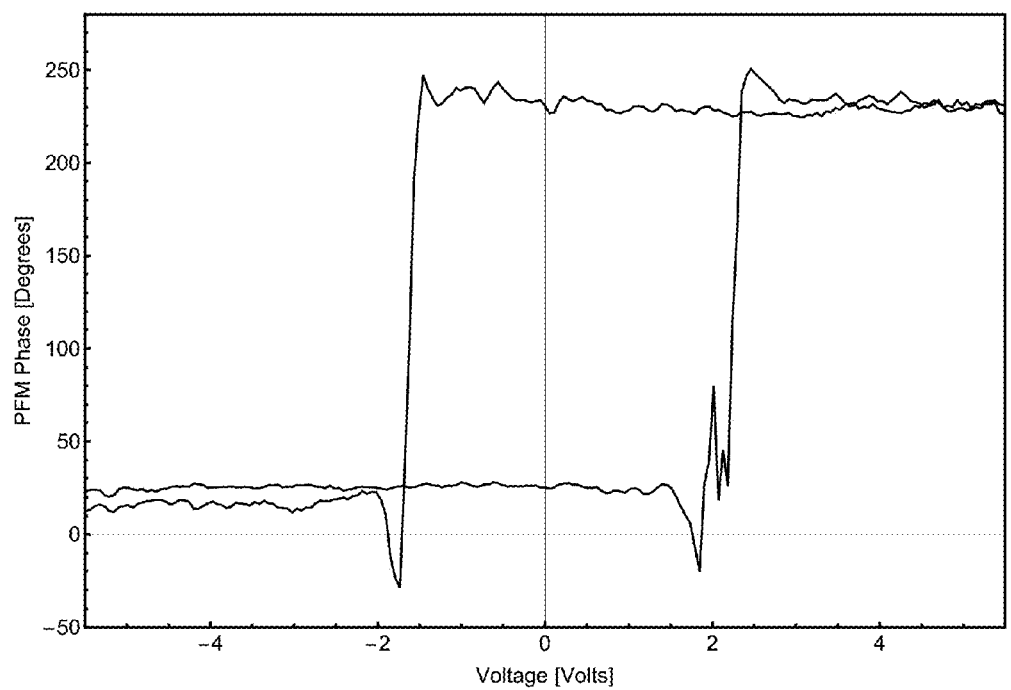
FIG. 19 is experimental data of PFM phase-voltage hysteresis of a 17 nm lithium niobate layer grown on $Ta/Co_{63}Ru_{37}$. Phase measured in the z direction, and voltage applied in the z direction.

Next, the role of the top electrode 12B is to establish electrical contact, provide a surface that helps maintain texture of the layers below it, protect the structure and remain conductive during subsequent fabrication. This layer must consist of at least one metallic or highly doped semiconductor layer. This layer can consist of any of the materials listed for the bottom electrode, 12A. The materials in the top electrode 12B may be amorphous, polycrystalline, or crystalline. If the materials are crystalline or polycrystalline, the crystal lattice may be oriented in a preferred direction. FIG. 17A, 17B, 17C shows 3 examples of some of the possible, but not limiting, ways the top electrode may be configured. FIG. 17A shows the preferred configuration of the top electrode. In this preferred configuration, the Ru layer is polycrystalline.

Further, the top electrode can contain transparent conductive oxides (TCO). Some examples of TCOs that the top electrode may be composed of are: Indium tin oxide (ITO), aluminum zinc oxide (AZO), gallium zinc oxide (GZO), SrTiO3, $LaNiO_3$, $SrRuO_3$, $La_{0.7}Sr_{0.3}MnO_3$, $La_{0.5}Ca_{0.5}MnO_3$.

The section of layers labeled R1 can be repeated on top of each other n times where n is a number from 1 to infinity. The repeated sections may also vary the thickness of any of the layers within the repeated section.

The preferred fabrication method of creating the layers of the memory device will be by sputtering in a magnetron deposition machine.

Second Embodiment

Figure 2:
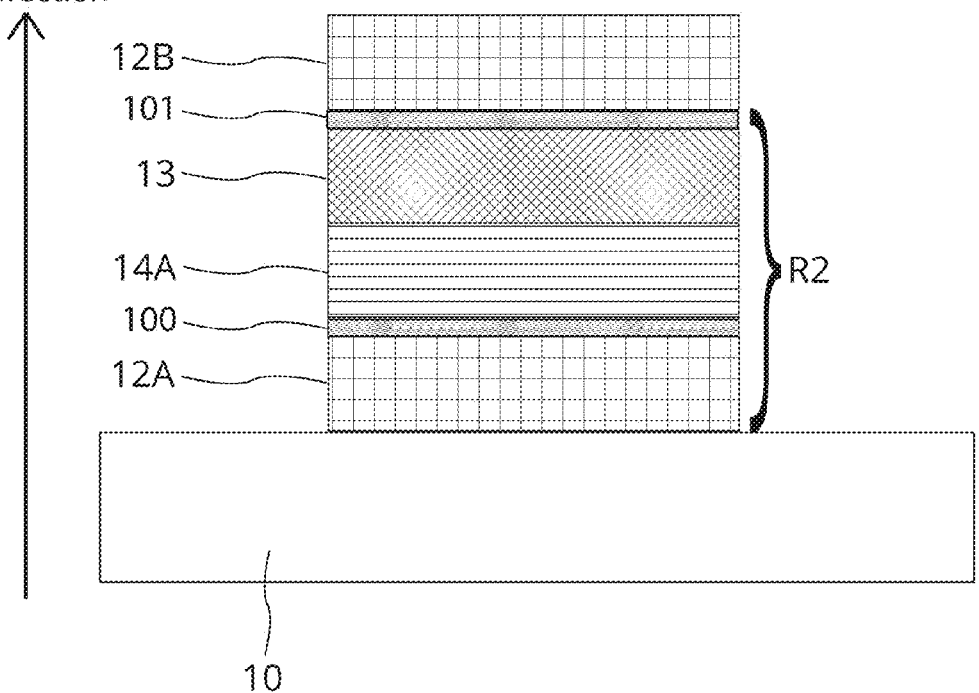
FIG. 2 is a diagram showing the construction of the ferroelectric memory device according to the second embodiment of the present invention.

FIG. 2 shows the construction of a ferroelectric memory device according to the second embodiment of the present invention.

Going from bottom to top, the second embodiment consists of a substrate 10, a bottom electrode 12A, a Schottky modulating interlayer 100, a semiconductor layer 14A, a ferroelectric layer 13, a Schottky modulating interlayer 101, and a top electrode 12B. The present embodiment also contains a section of layers labeled R2, which can be repeated n times where n is any number from 0 to infinity.

All of the layers, except for the semiconductor layer 14A, are exactly as described for the first embodiment. The names of the other layers have remained the same as in the first embodiment to show that they are identical. Additionally, the repeating layer is now labeled R2, but can be repeated in the same manner as described in the first embodiment.

The layer 14A can consists of at least one of the following semiconductor materials: silicon (Si), germanium (Ge), tin (Sn), beta iron silicide (β-FeSi2), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu1-xS (x varies from 1 to 2)), copper selenide (Cu1-xSe (x varies from 1 to 2)), copper indium disulfide (CuInS2), copper gallium disulfide (CuGaS2), copper indium gallium disulfide, (Cu(In1-xGax)S2 (x varies from 0 to 1)), copper indium diselenide (CuInSe2), copper gallium diselenide (CuGaSe2), copper indium gallium diselenide (Cu(In1-xGax)Se2 (x varies from 0 to 1)), copper silver indium gallium disulfide (Cu1-xAgx)(In1-yGay)S2 (x varies from 0 to 1, y varies from 0 to 1)), copper silver indium gallium diselenide (Cu1-xAgx)(In1-yGay)Se2 (x varies from 0 to 1, y varies from 0 to 1)), indium sulfide (In2S3), indium selenide (In2Se3), aluminum nitride (AlN), indium nitride (InN), gallium nitride (GaN), bismuth sulfide (Bi2S3), antimony sulfide (Sb2S3), silver sulfide (Ag2S), tungsten sulfide (WS2), tungsten selenide (WSe2), molybdenum sulfide (MoS2), molybdenum selenide (MoSe2), tin sulfide (SnSx (x varies from 1 to 2)), tin selenide (SnSex (x varies from 1 to 2)), copper tin sulfide (Cu4SnS4). Such semiconductors may be doped by adding an impurity of valence-three elements such as boron (B), gallium (Ga), indium (In), or aluminum (Al), in order to increase the number of free (in this case positive (hole)) charge carriers to form a p-type semiconductor. Alternatively, such semiconductors may be doped by adding an impurity of valence-five elements such as nitrogen (N), phosphorus (P), arsenic (As), or antimony (Sb) in order to increase the number of free (in this case negative (electron) charge carriers to form an n-type semiconductor. This layer 14A may also consist of a dielectric layer, a magnetic layer, or any of the ferroelectric materials listed for the ferroelectric layer 13. Layer 14A may be crystalline, polycrystalline, or amorphous. If it is a magnetic layer, it can be composed of any combination of the following elements and materials: Fe, Co, Ni, $Fe_xCo_y$-$Cr_zB_{1-x-y-z}$, $Fe_xRu_{1-x}$ where $0.6<x<1$, $Co_xNi_yRu_{1-x-y}$ where $0.7<x+y<1$, $Fe_xCo_{1-x}$ where $0<x<0.5$, $Co_xRu_yRe_zRh_iNi_jCr_kPt_{1-x-y-z-i-j-k}$ where $0.60<x+j<1$, $Fe_xNi_{1-x}$ $0<x<1$, Co/Ni multilayers, Co/(Pt or Pd) multilayers.

This embodiment can be annealed in the same way as the first embodiment.

Third Embodiment

Figure 3:
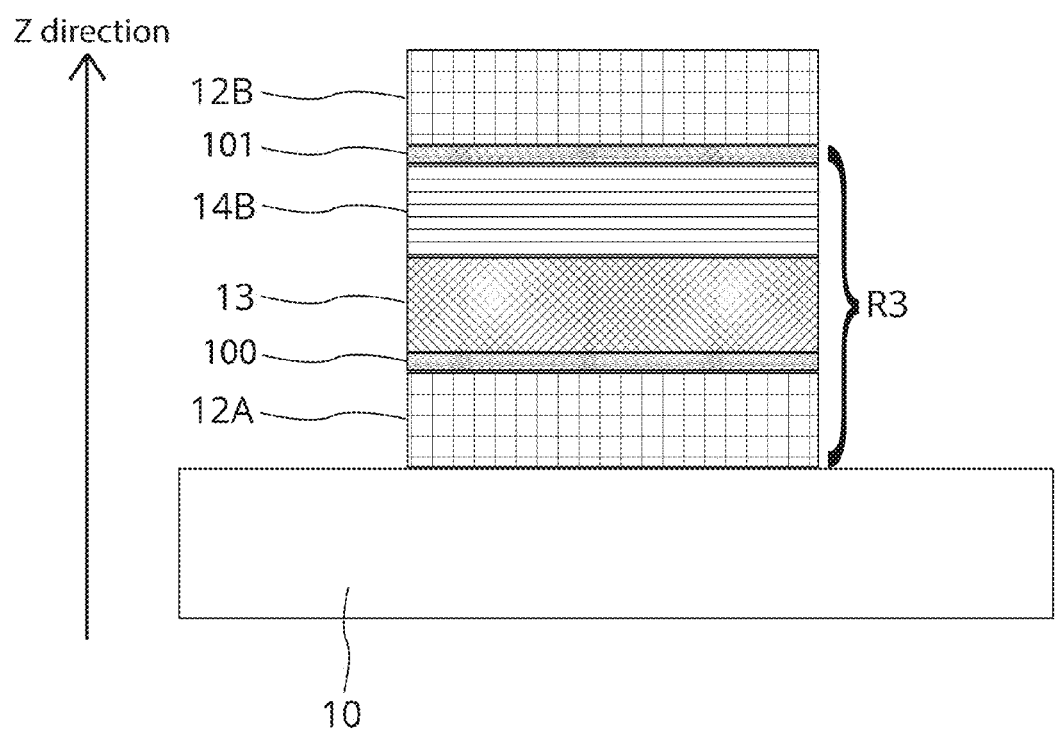
FIG. 3 is a diagram showing the construction of the ferroelectric memory device according to the third embodiment of the present invention.

FIG. 3 shows the construction of a ferroelectric memory device according to the third embodiment of the present invention.

Going from bottom to top, the third embodiment consists of a substrate 10, a bottom electrode 12A, a Schottky modulating interlayer 100, a ferroelectric layer 13, a semiconductor layer 14B, a Schottky modulating interlayer 101, and a top electrode 12B. The present embodiment also contains a section of layers labeled R3, which can be repeated n times where n is any number from 0 to infinity.

All of the layers are exactly as described for the second embodiment except the layer 14A has been moved to the top of the ferroelectric layer and is now called 14B. It is still described in exactly the same way as 14A was in the second embodiment. The names of the other layers have remained the same as in the first embodiment to show that they are identical.

Additionally, the repeating layer is now labeled R3, but can be repeated in the same manner as described in the first embodiment.

This embodiment can be annealed in the same way as the first embodiment.

Fourth Embodiment

Figure 4:
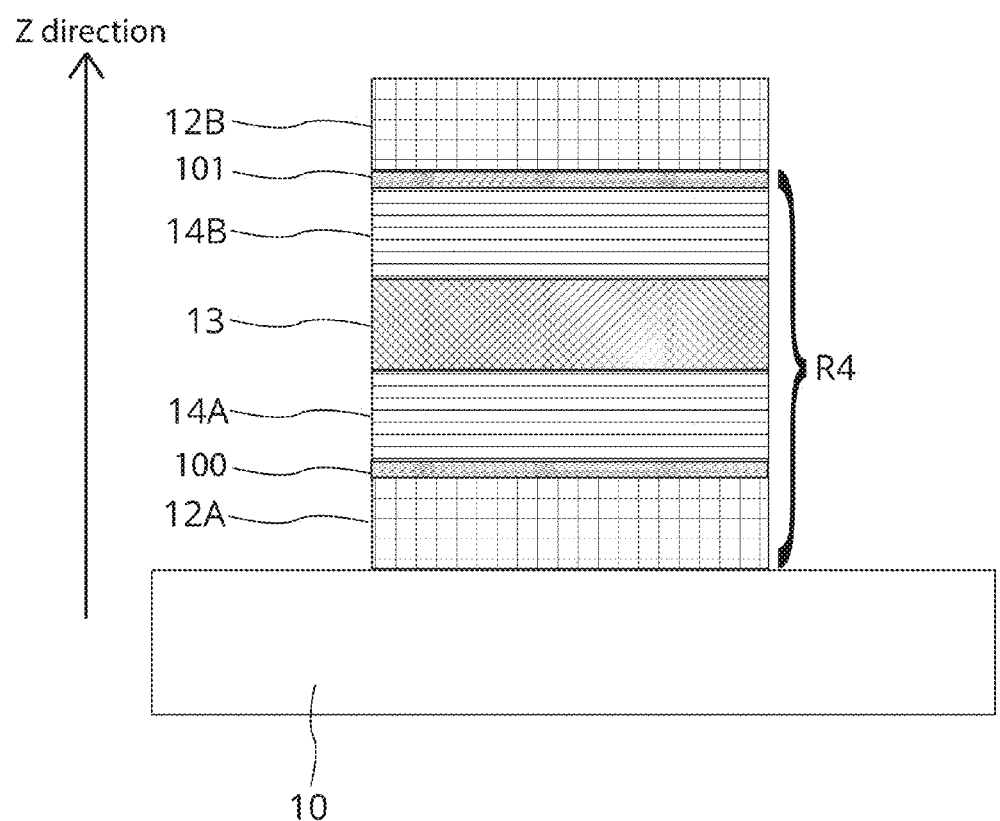
FIG. 4 is a diagram showing the construction of the ferroelectric memory device according to the fourth embodiment of the present invention.

FIG. 4 shows the construction of a ferroelectric memory device according to the fourth embodiment of the present invention.

Going from bottom to top, the fourth embodiment consists of a substrate 10, a bottom electrode 12A, a Schottky modulating interlayer 100, a semiconductor layer 14A, a ferroelectric layer 13, a semiconductor layer 14B, a Schottky modulating interlayer 101, and a top electrode 12B. The present embodiment also contains a section of layers labeled R4, which can be repeated n times where n is any number from 0 to infinity.

All of the layers in the fourth embodiment are as described in the first, second, and third embodiments. The names that describe the layers have remained the same to show that they are Identical. Additionally, the repeating layer is now labeled R3, but can be repeated in the same manner as described in the first embodiment.

This embodiment can be annealed in the same way as the first embodiment.

Fifth Embodiment

FIG. 5 shows the construction of a ferroelectric memory device according to the fifth embodiment of the present invention.

Going from bottom to top, the fifth embodiment consists of a substrate 10, a repeating layer L1 to LN where N is a number from 1 to infinity, and a top electrode 12B.

All of the layers in the fifth embodiment are as described in the first, second, third, and fourth embodiments. The names of the layers have remained the same to show that they are identical.

The repeating layers, as labeled with L1 to LN are made up of the repeating sections in each of the first, second, third, and fourth embodiments, which are labeled as R1, R2, R3, and R4. The repeating sections can all be from one of the first four embodiments, or a combination of repeating sections from any number of the first four embodiments in any order.

Each of the repeated layers is allowed to have a ferroelectric layer with the same thickness as the others, or have a ferroelectric layer with a different thickness as the others.

This embodiment can be annealed in the same way as the first embodiment.

What is claimed is:

1. A memory cell comprising: a bottom electrode comprising at least one metallic layer having a hexagonal close-packed lattice structure with <0001> growth directions, or face-centered cubic lattice structure with <111> growth directions, or face-centered cubic lattice structure with <001> growth directions, or body-centered cubic lattice structure with <110> growth directions, or body-centered cubic lattice structure with <001> growth directions; a first Schottky modulating layer, comprising a metallic or insulator material, formed over an area of said bottom electrode and in contact directly with a top surface of said bottom electrode; a ferroelectric layer, comprising a ferroelectric material, formed over an area of said first Schottky modulating layer and in contact directly with a top surface of said first Schottky modulating layer; a second Schottky modulating layer, comprising of a metallic or insulator material, formed over an area of said ferroelectric layer and in contact directly with a top surface of said ferroelectric layer; a top electrode formed over an area of said second Schottky modulating layer and in contact directly with a top surface of said second Schottky modulating layer.

2. The memory cell as claimed in claim 1, with the addition of a semiconductor layer, comprising a semiconductor material with uniform impurity concentration in the direction parallel with the plane of the layer, above said ferroelectric layer and below said second Schottky modulating layer and in contact directly with the top surface of said ferroelectric layer and in contact directly with the bottom surface of said second Schottky modulating layer.

3. The memory cell as claimed in claim 1, with the addition of a semiconductor layer, comprising a semiconductor material with uniform impurity concentration in the direction parallel with the plane of the layer, below said ferroelectric layer and above said first Schottky modulating layer and in contact directly with the bottom surface of said ferroelectric layer and in contact directly with the top surface of said first Schottky modulating layer.

4. The memory cell as claimed in claim 1, wherein said first Schottky modulating layer is comprised of a metal with a work function that causes a Schottky barrier to form at its adjacent interface with said ferroelectric layer and said second Schottky modulating layer is comprised of a metal with a work function that causes no Schottky barrier to form at its adjacent interface with said ferroelectric layer; or wherein said first Schottky modulating layer is comprised of a metal with a work function that causes no Schottky barrier to form at its adjacent interface with said ferroelectric layer and said second Schottky modulating layer comprised of a metal with a work function that causes a Schottky barrier to form at its adjacent interface with said ferroelectric layer; or wherein said first Schottky modulating layer is comprised of a metal with a work function that causes no Schottky barrier to form at its adjacent interface with said ferroelectric layer and said second Schottky modulating layer comprised of a metal with a work function that causes no Schottky barrier to form at its adjacent interface with said ferroelectric layer; or wherein said first Schottky modulating layer is comprised of a metal with a work function that causes a Schottky barrier to form at its adjacent interface with said ferroelectric layer and said second Schottky modulating layer comprised of a metal with a work function that causes a Schottky barrier to form at its adjacent interface with said ferroelectric layer.

5. The memory cell as claimed in claim 1, with the addition of a first semiconductor layer, comprising a semiconductor material with uniform impurity concentration in the direction parallel with the plane of the layer, below said ferroelectric layer and above said first Schottky modulating layer and in contact directly with the bottom surface of said ferroelectric layer and in contact directly with the top surface of said first Schottky modulating layer and a second semiconductor layer, comprising a semiconductor material with uniform impurity concentration in the direction parallel with the plane of the layer, above said ferroelectric layer and below said second Schottky modulating layer and in contact directly with the top surface of said ferroelectric layer and in contact directly with the bottom surface of said second Schottky modulating layer.

6. The memory cell as claimed in claim 1, with the addition of one or more repeated sections comprising the section of the memory cell as claimed in claim 1 that extends from the bottom of said bottom electrode to the top of said second Schottky modulating layer, (R1) or alternatively, the section of the memory cell as claimed in claims 2-4 that extends from the bottom of said bottom electrode to the top of said second Schottky modulating layer, (R2, R3, R4); said repeated sections can be stacked on top of another repeated section any number of times from 1 to infinity.

7. The memory cell as claimed in claim 1, wherein the said ferroelectric layer having the direction of the crystal lattice that corresponds with one of the ferroelectric easy axis aligned perpendicular to the surface of the film having a full width at half maximum of the x-ray diffraction rocking curve of less than 30 degrees.

8. The memory cell as claimed in claim 7, wherein said bottom electrode comprises at least two layers, wherein the first layer of the at least two layers is metallic and comprises at least one element from the group consisting of B, C, Ti, Cr, Mn, Co, Fe, Ni, Zr, Nb, Mo, Hf, Ta, and W, and the second layer of the at least two layers having a hexagonal close-packed lattice structure with <0001> growth directions, or face-centered cubic lattice structure with <111> growth directions, or face-centered cubic lattice structure with <001> growth directions, or body-centered cubic lattice structure with <110> growth directions, or body-centered cubic lattice structure with <001> growth directions.

9. The memory cell as claimed in claim 7, wherein said bottom electrode comprises at least two layers, wherein the first layer of the at least two layers is comprised of Ta with beta-Ta crystal structure with <002> growth directions, and the second layer of the at least two layers having a hexagonal close-packed lattice structure with <0001> growth directions, or face-centered cubic lattice structure with <111> growth directions, or face-cented cubic lattice structure with <001> growth directions, or body-centered cubic lattice structure with <110> growth directions, or body-centered cubic lattice structure with <001> growth directions.

10. The memory cell as claimed in claim 7, wherein said bottom electrode comprises at least three layers, wherein the first layer of the at least three layers is metallic and comprises at least one element from the group consisting of B, C, Ti, Cr, Mn, Co, Fe, Ni, Zr, Nb, Mo, Hf, Ta, and W, and the second layer of the at least three layers is comprised of MgO, and the third layer of the at least three layers having a face-centered cubic lattice structure with <001> growth directions, or body-centered cubic lattice structure with <001> growth directions.

11. The memory cell as claimed in claim 7, wherein said bottom electrode comprises at least four layers, wherein the first layer of the at least four layers is metallic and comprises at least one element from the group consisting of B, C, Ti, Cr, Mn, Co, Fe, Ni, Zr, Nb, Mo, Hf, Ta, and W, and the second layer of the at least four layers is comprised of MgO, and the third layer of the at least four layers is metallic and comprises at least one element from the group consisting of B, C, Ti, Cr, Mn, Co, Fe, Ni, Zr, Nb, Mo, Hf, Ta, and W, and the fourth layer of the at least four layers having an face-centered cubic lattice structure with <001> growth orientations, or a body-centered cubic lattice structure with <001> growth orientations.

12. The memory cell as claimed in claim 7, wherein said ferroelectric layer comprises a material selected from the group consisting of Lithium Niobate ($LiNbO_3$) Sodium Niobate ($NaNbO_3$) Potassium Niobate ($KNbO_3$) Lithium Sodium Potassium Niobate ($Li_{1-x-y}Nz_xK_yNbO_3$) where x, y can vary from 0 to 1 and x+y is less or equal to 1, Lithium Tantalate (LiTaO$_3$) Sodium Tantalate (NaTaO$_3$) Potassium Tantalate (KTaO$_3$ Lithium Sodium Potassium Tantalate (Li$_{1-x-y}$Na$_x$K$_y$TaO$_3$) where x, y can vary from 0 to 1 and x+y is less or equal to 1, Lithium Sodium Potassium and Tantalate and Niobate (Li$_{1-x-y}$Na$_x$K$_y$Nb$_{1-z}$Ta$_z$O$_3$) where x, y, and z can vary from 0 to 1, Barium Titanate (BaTiO$_3$) where Ba can be in part substituted with Sr and Ti with Fe, Bismuth Ferrite (BiFeO$_3$) where Bi can be in part replaced with Sr and Fe with Ta.

13. The memory cell as claimed in claim 7, wherein said bottom electrode comprises at least two layers, wherein the first layer of the at least two layers comprises at least one metallic material having a face-centered cubic lattice structure with <001> growth directions, the second layer of the at least two layers having perovskite crystal structure.

14. The memory cell as claimed in claim 7, wherein said bottom electrode comprises at least two metallic layers, wherein the first layer of the at least two metallic layers has Ta with beta-Ta crystal structure with <002> growth directions, and the second metallic layer of the at least two metallic layers has a hexagonal close-packed lattice structure with <0001> growth directions, or face-centered cubic lattice structure with <111> growth directions, or face-centered cubic lattice structure with <001> growth directions, or body-centered cubic lattice structure with <110> growth directions, or body-centered cubic lattice structure with <001> growth directions.

15. The memory cell as claimed in claim 7, wherein said bottom electrode comprises at least three metallic layers, wherein the first layer of the at least three metallic layers has Ta with beta-Ta crystal structure with <002> growth directions, and the second metallic layer of the at least three metallic layers has a hexagonal close-packed lattice structure with <0001> growth directions, or face-centered cubic lattice structure with <111> growth directions, and the third metallic layer of the at least three metallic layers has a hexagonal close-packed lattice structure with <0001> growth directions, or face-centered cubic lattice structure with <111> growth directions.

16. A method for reading information from the memory cells described in this patent comprising applying a voltage across the bottom and top electrodes, that is small enough to not fully change the polarization state, and measuring the resistance between the bottom and top electrodes; the resistance is then used to determine the magnitude and direction of at least one component of the remnant polarization which can be used to determine the stored information via the binary-polarization mapping scheme.

17. An information to physical parameter mapping scheme comprising a map of binary numbers to the magnitude and direction of the ferroelectric remnant polarization of a ferroelectric material, that allows for the storage of more than 1 bit of information in a single polarization wherein each distinct binary value is mapped to a distinct magnitude and direction of the ferroelectric remnant polarization.

* * * * *